(12) United States Patent
Shikahama et al.

(10) Patent No.: US 12,100,724 B2
(45) Date of Patent: Sep. 24, 2024

(54) OPTICAL ELEMENT, OPTICAL ELEMENT ARRAY, LENS GROUP, ELECTRONIC APPARATUS, AND METHOD OF PRODUCING OPTICAL ELEMENT

(71) Applicant: SONY SEMICONDUCTOR SOLUTIONS CORPORATION, Kanagawa (JP)

(72) Inventors: Yasuhiro Shikahama, Kanagawa (JP); Kenji Takeo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 835 days.

(21) Appl. No.: 17/273,543

(22) PCT Filed: Sep. 10, 2019

(86) PCT No.: PCT/JP2019/035448
§ 371 (c)(1),
(2) Date: Mar. 4, 2021

(87) PCT Pub. No.: WO2020/059569
PCT Pub. Date: Mar. 26, 2020

(65) Prior Publication Data
US 2021/0202560 A1 Jul. 1, 2021

(30) Foreign Application Priority Data

Sep. 19, 2018 (JP) ................................ 2018-174754
Aug. 14, 2019 (JP) ................................ 2019-148765

(51) Int. Cl.
G02B 27/02 (2006.01)
G02B 3/00 (2006.01)
(Continued)

(52) U.S. Cl.
CPC ...... H01L 27/14627 (2013.01); G02B 3/0068 (2013.01); G02B 27/0025 (2013.01)

(58) Field of Classification Search
CPC .......... H01L 27/14627; H01L 27/1463; H01L 27/14632; H01L 27/1462; H01L 27/1464;
(Continued)

(56) References Cited

U.S. PATENT DOCUMENTS 7,675,096 B2 * 3/2010 Takahashi ......... H01L 27/14627
257/187
2003/0168679 A1 9/2003 Nakai et al.
(Continued)

FOREIGN PATENT DOCUMENTS

JP H03-190168 8/1991
JP H03-218067 9/1991
(Continued)

OTHER PUBLICATIONS

International Search Report prepared by the Japan Patent Office on Nov. 28, 2019, for International Application No. PCT/JP2019/035448.

*Primary Examiner* — Euncha P Cherry
(74) *Attorney, Agent, or Firm* — Sheridan Ross PC

(57) ABSTRACT

The present technology includes: a substrate, a stepped structure being formed on one surface of the substrate, the stepped structure having a stepped surface having a different height from the one surface; and a coating layer that continuously covers the stepped structure and the one surface on a periphery of the stepped structure and causes light to be transmitted therethrough or reflects the light.

19 Claims, 43 Drawing Sheets

(51) Int. Cl.
  *G02B 27/00*   (2006.01)
  *H01L 27/146*  (2006.01)
(58) Field of Classification Search
  CPC ......... H01L 27/14621; H01L 27/14629; H01L 27/14685; G02B 3/0068; G02B 27/0025; G02B 3/0012
  See application file for complete search history.

(56) References Cited

U.S. PATENT DOCUMENTS

| | | |
|---|---|---|
| 2006/0103941 A1 | 5/2006 | Yamaguchi et al. |
| 2016/0013233 A1 | 1/2016 | Noudo et al. |

FOREIGN PATENT DOCUMENTS

| | | |
|---|---|---|
| JP | 2003-229553 | 8/2003 |
| JP | 2006-145627 | 6/2006 |
| JP | 2007-048967 | 2/2007 |
| WO | WO 2014/141991 | 9/2014 |

\* cited by examiner

OPTICAL ELEMENT, OPTICAL ELEMENT ARRAY, LENS GROUP, ELECTRONIC APPARATUS, AND METHOD OF PRODUCING OPTICAL ELEMENT

CROSS REFERENCE TO RELATED APPLICATIONS

This application is a national stage application under 35 U.S.C. 371 and claims the benefit of PCT Application No. PCT/JP2019/035448 having an international filing date of 10 Sep. 2019, which designated the United States, which PCT application claimed the benefit of Japanese Patent Application Nos. 2018-174754, filed 19 Sep. 2018 and 2019-148765, filed 14 Aug. 2019, the entire disclosures of each of which are incorporated herein by reference.

TECHNICAL FIELD

The present technology relates to an optical element, an optical element array, a lens group, an electronic apparatus, and a method of producing the optical element.

BACKGROUND ART

Conventionally, there has been proposed a lens including a substrate having a plurality of underlying patterns and a coating layer that covers each of the upper surfaces of the underlying patterns and causes light to be transmitted therethrough (see, for example, Patent Literature 1). The lens described in Patent Literature 1 is formed on the upper surface of each of the underlying patterns by forming a lens forming pattern layer on the upper surface of each of the underlying patterns and then thermally reflowing the lens forming pattern layer.

CITATION LIST

Patent Literature

Patent Literature 1: Japanese Patent Application Laid-open No. 2000-307090

DISCLOSURE OF INVENTION

Technical Problem

However, in the lens described in Patent Literature 1, because a curved structure is formed by utilizing the front surface tension on the upper surface of the underlying pattern, i.e., on the plane, the flexibility of designing is low.

It is an object of the present disclosure to provide an optical element, an optical element array, a lens group, an electronic apparatus, and a method of producing the optical element that have high flexibility of designing.

Solution to Problem

An optical element according to the present disclosure includes: (a) a substrate, a stepped structure being formed on one surface of the substrate, the stepped structure having a stepped surface having a different height from the one surface; and (b) a coating layer that continuously covers the stepped structure and the one surface on a periphery of the stepped structure and causes light to be transmitted therethrough or reflects the light.

Further, an optical element array according to the present disclosure includes: (a) a substrate having a plurality of stepped structures regularly arranged in a two-dimensional array; and (b) a coating layer that continuously covers the plurality of stepped structures and a surface of the substrate on a periphery of the plurality of stepped structures, each of portions of the coating layer covering the plurality of stepped structures causing light to be transmitted therethrough or reflects the light.

Further, an optical element array according to the present disclosure includes: (a) a plurality of first lenses regularly arranged in a two-dimensional array; and (b) a plurality of second lenses that includes a substrate, a plurality of stepped structures being formed on one surface of the substrate, each of the plurality of stepped structures having an annular stepped surface having a different height from the one surface, and a coating layer that continuously covers the plurality of stepped structures and the one surface on a periphery of the plurality of stepped structures and causes light to be transmitted therethrough, and corrects aberrations caused by the plurality of first lenses, light before or after being transmitted through the plurality of first lenses entering the plurality of second lenses.

Further, a lens group according to the present disclosure includes: (a) a first lens; and (b) a second lens that corrects an aberration caused by the first lens, light before or after being transmitted through the first lens entering the second lens, in which
the second lens includes (c) a substrate, a stepped structure being formed on one surface of the substrate, the stepped structure having an annular stepped surface having a different height from the one surface, and (d) a coating layer that continuously covers the stepped structure and the one surface on a periphery of the stepped structure and causes light to be transmitted therethrough.

Further, an electronic apparatus according to the present disclosure includes: (a) a solid-state imaging device that includes a microlens array including a substrate having a plurality of stepped structures of a plurality of stages regularly arranged in a two-dimensional array, and a coating layer that continuously covers the plurality of stepped structures of the plurality of stages and a surface of the substrate on a periphery of the plurality of stepped structures, each of portions of the coating layer covering the plurality of stepped structures having a lens shape; (b) an optical lens that forms an image of image light from a subject onto an imaging surface of the solid-state imaging device; and (c) a signal processing circuit that performs signal processing on a signal output from the solid-state imaging device.

Further, a method of producing an optical element according to the present disclosure includes: (a) a step of forming a stepped structure on a substrate; (b) a step of applying a coating liquid to the substrate on which the stepped structure has been formed; and (c) a step of drying the coating liquid so that a coating layer that continuously covers the stepped structure and a surface of the substrate on a periphery of the stepped structure and causes light to be transmitted therethrough or reflects the light is formed.

Further, a method of producing an optical element according to the present disclosure includes: (a) a step of forming a plurality of stepped structures regularly arranged in a two-dimensional array on a substrate; (b) a step of applying a coating liquid to the substrate on which the plurality of stepped structures has been formed; and (c) a step of drying the coating liquid so that a coating layer that continuously covers the plurality of stepped structures and a surface of the substrate on a periphery of the plurality of stepped structures and causes light to be transmitted therethrough is formed, in which (d) each of the plurality of stepped structures includes an annular recessed portion for forming a lens, light before or after being transmitted through a color filter entering the lens, and (e) in the step of forming the plurality of stepped structures on the substrate, a width and a diameter of each of the plurality of annular recessed portions are adjusted in accordance with a wavelength range of light transmitted through the color filter corresponding to the annular recessed portion.

MODE(S) FOR CARRYING OUT THE INVENTION

Figure 1:
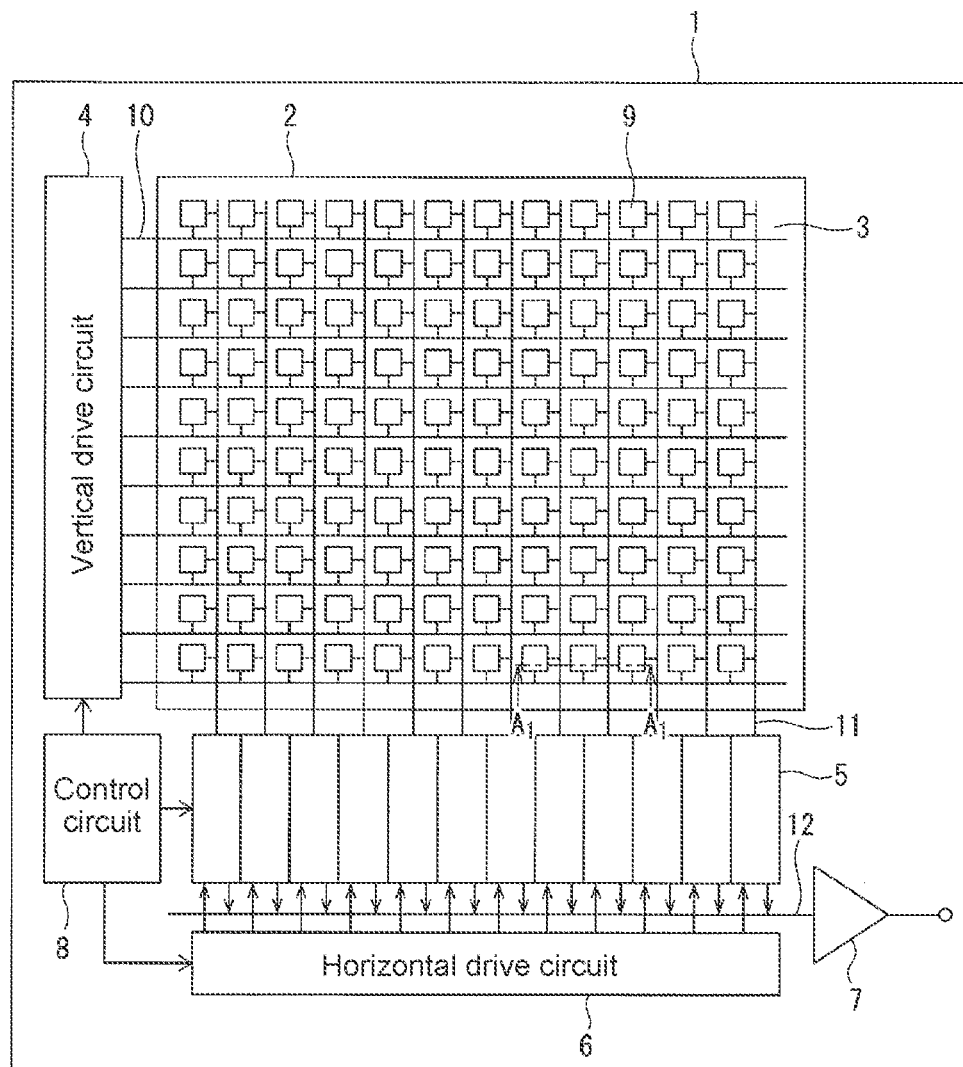
FIG. 1 is a diagram showing a configuration of an entire solid-state imaging device according to a first embodiment of the present disclosure.

Hereinafter, an example of an optical element, an optical element array, a lens group, an electronic apparatus, and a method of producing the optical element according to an embodiment of the present disclosure will be described with reference to FIG. 1 to FIG. 56. The embodiments of the present disclosure will be described in the following order. Note that the present disclosure is not limited to the following examples. Further, the effects described herein are merely examples and are not limited, and additional effects may be exerted.

1. First embodiment: solid-state imaging device
   1-1 Configuration of entire solid-state imaging device
   1-2 Configuration of main parts
   1-3 Method of producing wafer lens
2. Second embodiment: solid-state imaging device
   2-1 Configuration of main parts
   2-2 Method of producing wafer lens
3. Third embodiment: solid-state imaging device
   3-1 Configuration of main parts
   3-2 Method of producing correction lens
   3-3 Modified example
4. Fourth embodiment: electronic apparatus
5. Application example to moving objects
6. Application example to endoscopic surgery system

1. First Embodiment

1-1 Configuration of Entire Solid-State Imaging Device

The solid-state imaging device according to the first embodiment of the present disclosure will be described.

FIG. 1 is a schematic configuration diagram showing the entire solid-state imaging device according to the first embodiment of the present disclosure.

Figure 52:
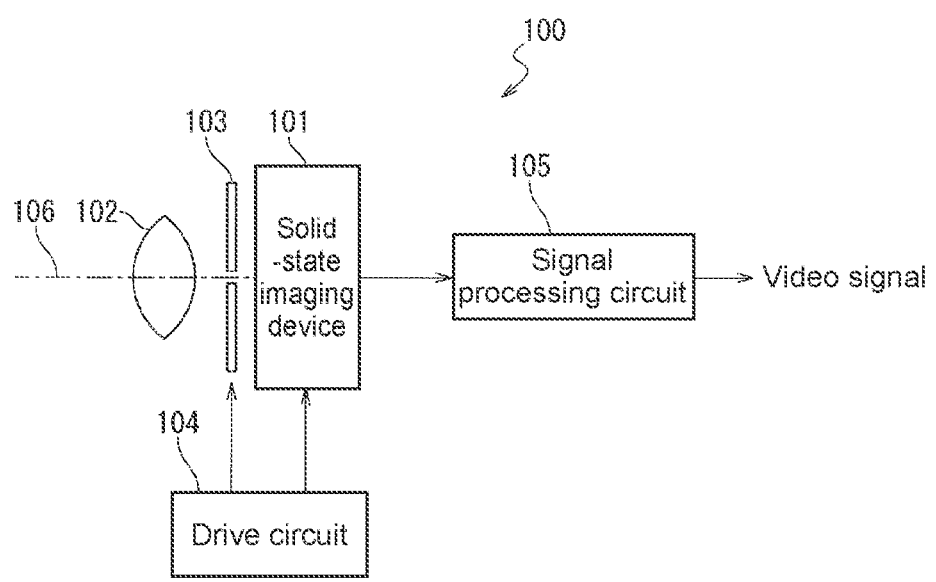
FIG. 52 is a schematic configuration diagram of an electronic apparatus according to a fourth embodiment of the present disclosure.

A solid-state imaging device 1 in FIG. 1 is a back surface illumination CMOS (Complementary Metal Oxide Semiconductor) image sensor. As shown in FIG. 52, the solid-state imaging device 1 (101) takes in image light (incident light 106) from a subject via an optical lens 102, and the light amount of the incident light 106 imaged on the imaging surface is converted into an electrical signal in units of pixels and output as a pixel signal.

As shown in FIG. 1, the solid-state imaging device 1 according to the first embodiment includes a substrate 2, a pixel region 3, a vertical drive circuit 4, a column signal processing circuit 5, a horizontal drive circuit 6, an output circuit 7, and a control circuit 8.

The pixel region 3 includes a plurality of pixels 9 regularly arranged in a two-dimensional array on the substrate 2. The pixel 9 includes a photoelectric conversion unit 23 shown in FIG. 2 and a plurality of pixel transistors (not shown). As the plurality of pixel transistors, for example, four transistors, i.e., a transfer transistor, a reset transistor, a selection transistor, and an amplifier transistor, can be employed. In addition, for example, three transistors excluding the selection transistor may be employed.

The vertical drive circuit 4 includes, for example, a shift register, selects a desired pixel drive wiring 10, and supplies a pulse for driving the pixel 9 to the selected pixel drive wiring 10 to drive the respective pixels 9 on a row-by-row basis. That is, the vertical drive circuit 4 selectively scans the respective pixels 9 of the pixel region 3 on a row-by-row basis sequentially in the perpendicular direction, and supplies a pixel signal based on the signal charges generated in accordance with the amount of received light in the photoelectric conversion unit 23 of each of the pixels 9 to the column signal processing circuit 5 via a vertical signal line 11.

The column signal processing circuit 5 is disposed, for example, for each column of the pixels 9, and performs signal processing such as noise removal on a signal output from the pixels 9 in one row for each pixel column. For example, the column signal processing circuit 5 performs signal processing such as CDS (Correlated Double Sampling) for removing fixed pattern noise unique to the pixel and AD (Analog Digital) conversion.

The horizontal drive circuit 6 includes, for example, a shift register, sequentially outputs a horizontal scan pulse to the column signal processing circuit 5 to select each of the column signal processing circuits 5 in turn, and causes each of the column signal processing circuits 5 to output a pixel signal on which signal processing has been performed to a horizontal signal line 12.

The output circuit 7 performs signal processing on a pixel signal sequentially supplied from each of the column signal processing circuits 5 via the horizontal signal line 12 and outputs the obtained pixel signal. As the signal processing, for example, buffing, black level adjustment, column variation correction, or various digital signal processing can be used.

The control circuit 8 generates clock signals and control signals that serve as a reference for operations of the vertical drive circuit 4, the column signal processing circuit 5, the horizontal drive circuit 6, and the like on the basis of a vertical synchronization signal, a horizontal synchronization signal, and a master clock signal. Then, the control circuit 8 outputs the generated clock signals and control signals to the vertical drive circuit 4, the column signal processing circuit 5, the horizontal drive circuit 6, and the like.

1-2 Configuration of Main Parts

Figure 2:
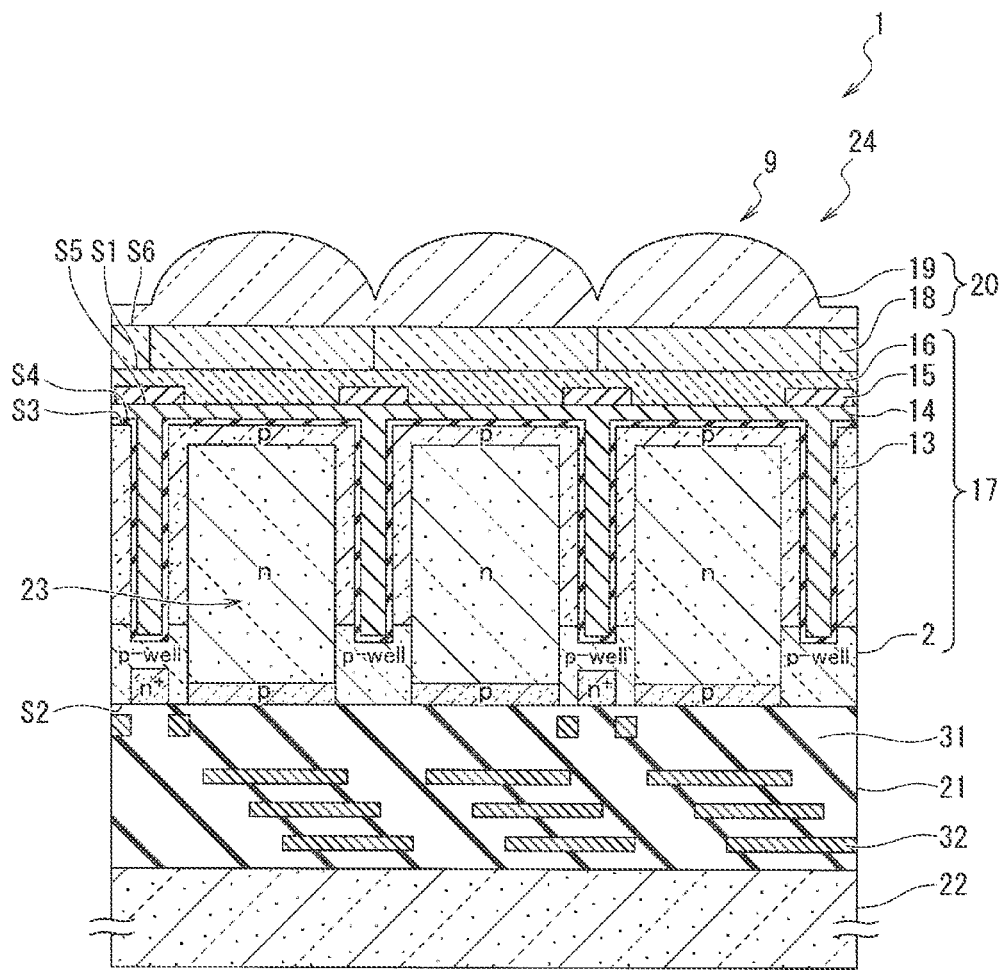
FIG. 2 is a diagram showing a cross-sectional configuration of a pixel region taken along the line $A_1$-$A_1$ in FIG. 1.

Next, a detailed structure of the solid-state imaging device 1 in FIG. 1 will be described. FIG. 2 is a diagram showing a cross-sectional configuration of the pixel region 3 of the solid-state imaging device 1 according to the first embodiment. In FIG. 2, a back surface illumination CMOS image sensor (CMOS type solid-state imaging device) is used as the solid-state imaging device 1.

As shown in FIG. 2, the solid-state imaging device 1 according to the first embodiment includes a light receiving layer 17 obtained by stacking the substrate 2, a fixed charge film 13, an insulating film 14, a light-shielding film 15, and a flattening film 16 in the stated order. Further, on the surface (hereinafter, referred to also as the "back surface S1") of the light receiving layer 17 on the side of the flattening film 16, a light collection layer 20 obtained by stacking a color filter 18 and a wafer lens 19 (optical element) in the stated order is formed. Here, the wafer lens 19 is the one referred to also as the on-chip lens or microlens. Further, on the surface (hereinafter, referred to also as the "front surface S2") of the light receiving layer 17 on the side of the substrate 2, a wiring layer 21 and a support substrate 22 are stacked in the stated order. Note that since the back surface S1 of the light receiving layer 17 and the back surface of the flattening film 16 are the same surface, also the back surface of the flattening film 16 will be referred to as the "back surface S1" in the following description. Further, since the front surface S2 of the light receiving layer 17 and the front surface of the substrate 2 are the same surface, also the front surface of the substrate 2 will be referred to as the "front surface S2" in the following description.

The substrate 2 includes, for example, a semiconductor substrate formed of silicon (Si), and forms the pixel region 3 as shown in FIG. 1. As shown in FIG. 2, the plurality of photoelectric conversion units 23 formed on the substrate 2, i.e., the plurality of pixels 9 including the plurality of photoelectric conversion units 23 embedded in the substrate 2, are arranged in a two-dimensional array pattern. In the photoelectric conversion unit 23, signal charges corresponding to the amount of incident light are generated, and the generated signal charges are accumulated.

The fixed charge film 13 continuously covers the entire back surface S3 side (the entire light receiving surface side) of the substrate 2. Further, the insulating film 14 continuously covers the entire back surface S4 side (the entire light receiving surface side) of the fixed charge film 13. Further, the light-shielding film 15 is formed in a lattice pattern on a part of a back surface S5 side of the insulating film 14 (a part of the light receiving surface side) so as to open the light receiving surface of each of the plurality of photoelectric conversion units 23. Further, the flattening film 16 continuously covers the entire back surface S5 side (the entire light receiving surface side) of the insulating film 14 including the light-shielding film 15 so that the back surface S1 of the light receiving layer 17 is a flat surface without irregularities.

The color filters 18 are formed on the back surface S1 side (light receiving surface side) of the flattening film 16 corresponding to the respective pixels 9. Thus, the color filters 18 form a color filter array regularly arranged in a two-dimensional array. Each of the color filters 18 is formed to cause certain wavelengths, such as red, green, and blue, to be transmitted therethrough. Then, the color filter 18 causes light of a specific wavelength to be transmitted therethrough and causes the transmitted light to enter the photoelectric conversion unit 23 of the substrate 2.

The wafer lenses 19 are formed on a back surface S6 side (light receiving surface side) of the color filter 18 corresponding to the respective pixels 9. Thus, the wafer lenses 19 form a microlens array 24 (optical element array) regularly arranged in a two-dimensional array. The wafer lens 19 collects the image light (the incident light 106) from a subject shown in FIG. 52, and causes the collected incident light 106 to be transmitted through the color filter 18 and then enter the photoelectric conversion unit 23.

Figure 3A:
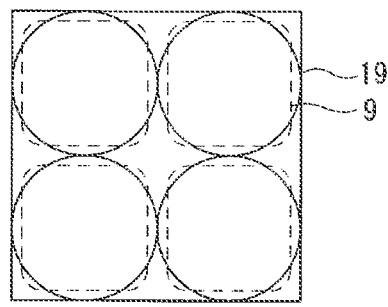
FIG. 3A is a diagram showing an enlarged planar configuration of a wafer lens.
Figure 3B:
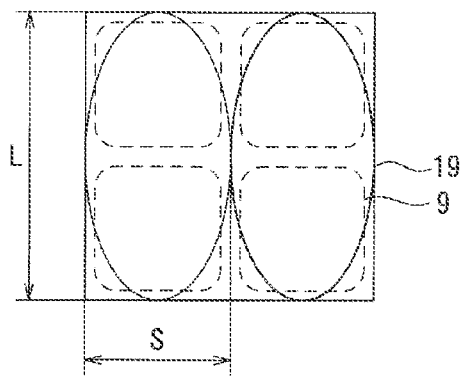
FIG. 3B is a diagram showing an enlarged planar configuration of the wafer lens.
Figure 3C:
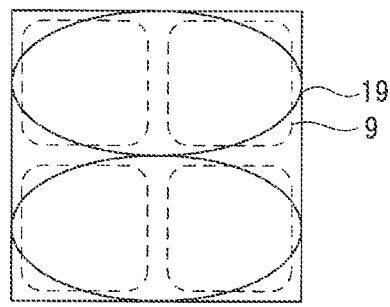
FIG. 3C is a diagram showing an enlarged planar configuration of the wafer lens.
Figure 3D:
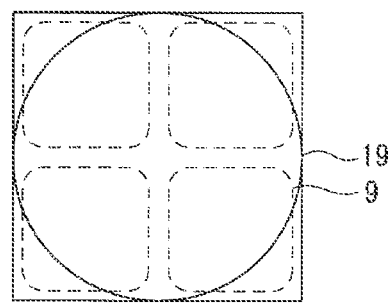
FIG. 3D is a diagram showing an enlarged planar configuration of the wafer lens.

Note that in the first embodiment, the example in which one wafer lens 19 is formed corresponding to one pixel 9 has been shown as shown in FIG. 3A, but other configurations may be employed. For example, as shown in FIG. 3B, FIG. 3C, and FIG. 3D, one wafer lens 19 may be formed corresponding to a plurality of pixels 9 such as 2×1 pixels, 1×2 pixels, and 2×2 pixels.

Figure 4:
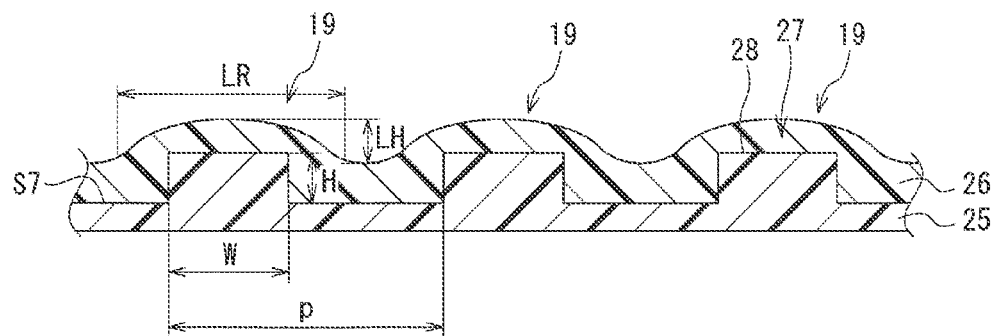
FIG. 4 is a diagram showing an enlarged stepped-surface configuration of a substrate.

As shown in FIG. 4, the wafer lens 19 includes a substrate 25 and a coating layer 26.

The substrate 25 is formed on the back surface S6 side (light receiving surface side) of the color filter 18, and includes a plurality of stepped structures 27, which is a projecting portion, formed on a back surface S7 side (light receiving surface side) of the substrate 25. Each of the stepped structures 27 is formed corresponding to the pixel 9 and has a stepped surface 28 of one or more stages. As the stepped surface 28, for example, a surface having a height different from that of the back surface S7 of the substrate 25 can be used. For example, a surface in parallel with the back surface S7 of the substrate 25 can be employed. FIG. 4 illustrates a case where the number of stages of the stepped surface 28 of the stepped structure 27 is one.

Figure 5A:
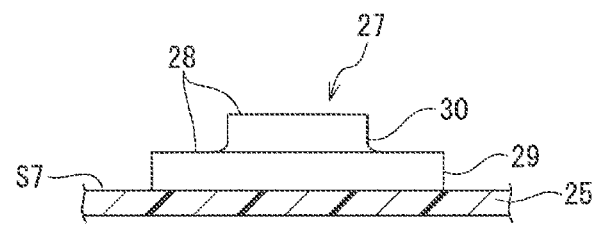
FIG. 5A is a diagram showing an enlarged stepped structure.
Figure 5B:
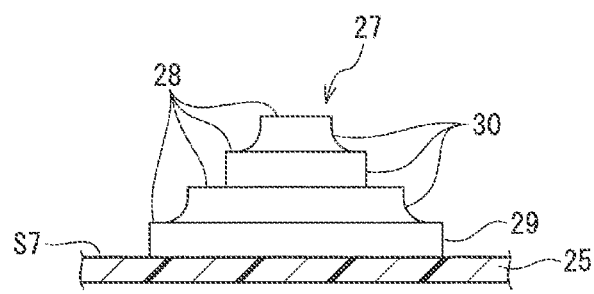
FIG. 5B is a diagram showing an enlarged stepped structure.

As shown in FIG. 5A and FIG. 5B, the number of stages of the stepped surface 28 of the stepped structure 27 may be two or more. In the case where the stepped surface 28 of two or more stages is provided, at least one of a surface perpendicular to the back surface S7 (surface on the light receiving surface side) of the substrate 25 and an inclined surface and a curved surface inclined with respect to the normal direction of the back surface S7 can be used as side surfaces 29 and 30 in the stepped structure 27. The side surface 29 is a surface for connecting the back surface S7 of the substrate 25 and the stepped surface 28. Further, the side surface 30 is a surface for connecting the two stepped surfaces 28 and 28. FIG. 5A illustrates a case where the number of stages of the stepped surface 28 of the stepped structure 27 is two, the side surface 29 is a perpendicular surface, and the side surface 30 is a curved surface. Further, FIG. 5B illustrates a case where the number of stages of the stepped surface 28 of the stepped structure 27 is four, the side surface 29 is a perpendicular surface, the side surface 30 of the lowermost part is a perpendicular surface, the side surface 30 of the intermediate part is a curved surface, and the side surface 30 of the uppermost part is a curved surface. When the number of stages of the stepped surface 28 is two or more, the upper surface of the coating layer 26 can be formed in a smooth curved surface shape, and the wafer lens 19 having a large curvature can be easily formed.

Figure 6A:
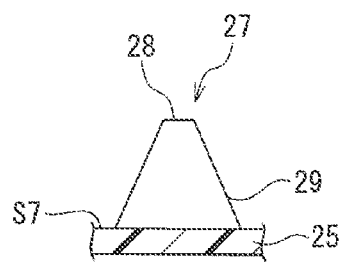
FIG. 6A is a diagram showing an enlarged stepped structure in a solid-state imaging device according to a modified example.
Figure 6B:
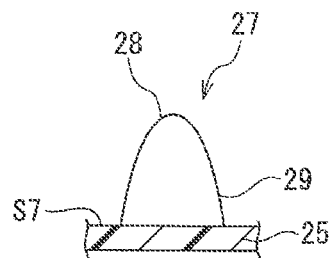
FIG. 6B is a diagram showing an enlarged stepped structure in the solid-state imaging device according to the modified example.

Note that even if the number of stages of the stepped surface 28 of the stepped structure 27 is one, the upper surface of the coating layer 26 can be formed in a smooth curved surface shape and the wafer lens 19 having a large curvature can be formed by using, as the side surface 29 of the stepped structure 27, an inclined surface or curved surface inclined with respect to the normal direction of the back surface S7 of the substrate 25 (the surface of the light receiving surface side), as shown in FIG. 6A and FIG. 6B. FIG. 6A illustrates a case where the number of stages of the stepped surface 28 is one and the side surface 29 is an inclined surface. Further, FIG. 6B illustrates a case where the number of stages of the stepped surface 28 is one and the side surface 29 is a curved surface.

The inclination angle of the inclined surface is favorably within the range of 0 degrees or more and 60 degrees or less with respect to the normal direction of the back surface S7 (surface of the light receiving surface side) of the substrate 25. In particular, the range of 15 degrees or more and 60 degrees or less is more favorable. Further, the ratio of a width W and a height H of the stepped structure 27 shown in FIG. 4 is favorably in the range of 1:10 to 10:1. In particular, the range of 1:5 to 5:1 is more favorable. As the width W, for example, the diameter of the bottom surface of the stepped structure 27 can be employed in the case where the stepped structure 27 has a circular shape in plan view. Further, in the case where the stepped structure 27 has a rectangular shape, the width of the short side of the bottom surface of the stepped structure 27 can be employed. Further, the width W of the stepped structure 27 is less than or equal to a pitch p of the stepped structure 27 (e.g., 50 µm or less).

Figure 7A:
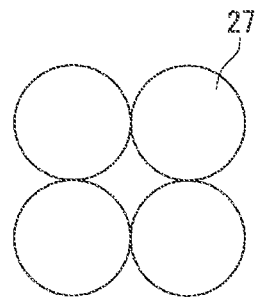
FIG. 7A is a diagram showing an enlarged stepped structure.
Figure 7B:
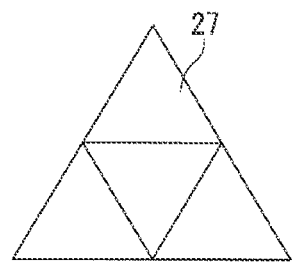
FIG. 7B is a diagram showing an enlarged stepped structure.
Figure 7C:
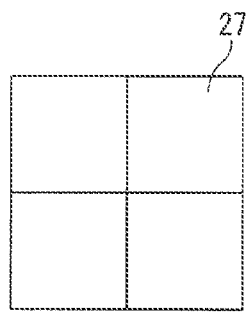
FIG. 7C is a diagram showing an enlarged stepped structure.
Figure 7D:
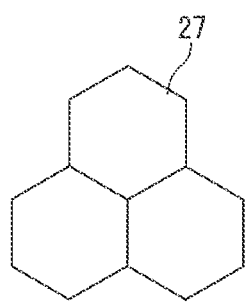
FIG. 7D is a diagram showing an enlarged stepped structure.
Figure 7E:
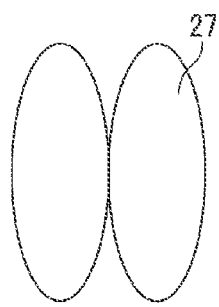
FIG. 7E is a diagram showing an enlarged stepped structure.

Further, as the planar shape of the stepped structure 27, as shown in FIG. 7A, FIG. 7B, FIG. 7C, FIG. 7D, and FIG. 7E, a circular shape, a polygonal shape, an elliptical shape, or the like can be used in accordance with the shape of each of the pixels 9, the layout of the plurality of pixels 9 when one wafer lens 19 corresponds to the plurality of pixels 9, and the like. The polygonal shape may be, for example, one in which the corner portions are rounded, as well as one in which the corner portions are angled. FIG. 7A illustrates a case where the planar shape of the stepped structure 27 is a circular shape. Further, FIG. 7B illustrates a case where the planar shape of the stepped structure 27 is a triangular shape. Further, FIG. 7C illustrates a case where the planar shape of the stepped structure 27 is a rectangular shape. Further, FIG. 7D illustrates a case where the planar shape of the stepped structure 27 is a hexagonal shape. Further, FIG. 7E illustrates a case where the planar shape of the stepped structure 27 is an elliptical shape. Here, in the case where an elliptical shape is used as the planar shape of the stepped structure 27, it is favorable that the ratio (aspect ratio) of the long side L and the short side S of the elliptical shape shown in FIG. 3B be 1 or more and 5 or less.

Figure 8A:
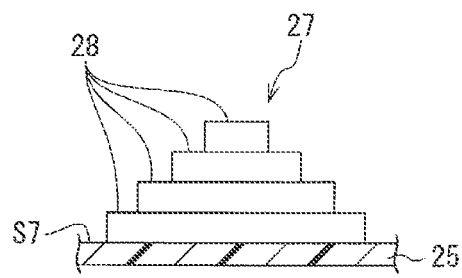
FIG. 8A is a diagram showing an enlarged stepped structure, and is a side surface diagram of a stepped structure in which stepped surfaces have a concentric circular shape.
Figure 8B:
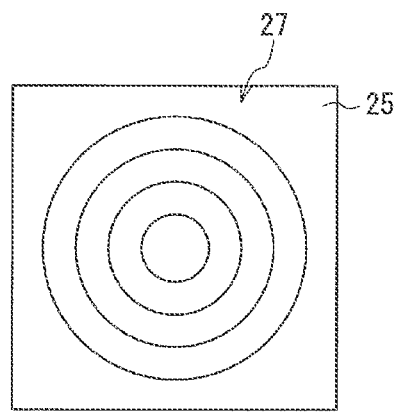
FIG. 8B is a diagram showing an enlarged stepped structure, and is a plan view of the stepped structure in FIG. 8A.
Figure 8C:
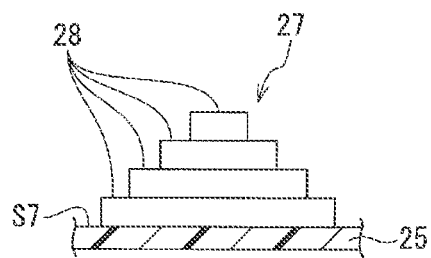
FIG. 8C is a diagram showing an enlarged stepped structure, and is a side surface diagram of a stepped structure in which stepped surfaces have a concentric rectangular shape.
Figure 8D:
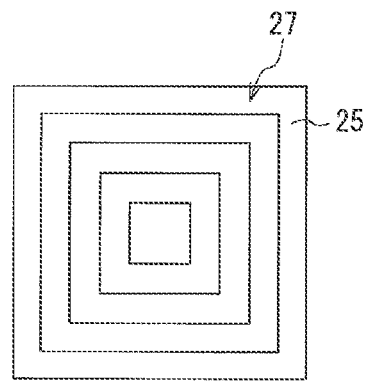
FIG. 8D is a diagram showing an enlarged stepped structure, and is a plan view of the stepped structure in FIG. 8C.

Further, in the case where the number of stages of the stepped surface 28 of the stepped structure 27 is two or more as shown in FIG. 8A and FIG. 8C, it is favorable to arrange the stepped surfaces 28 so that the outer peripheries of the stepped surfaces 28 are separated from each other in plan view as shown in FIG. 8B and FIG. 8D. FIG. 8A and FIG. 8B illustrate a case where the stepped surfaces 28 are arranged such that the outer peripheries of the stepped surfaces 28 form a plurality of concentric circles in plan view. Further, FIG. 8C and FIG. 8D illustrate a case where the stepped surfaces 28 are arranged such that the outer peripheries of the stepped surfaces 28 form a plurality of concentric rectangles in plan view.

Note that FIG. 8A to FIG. 8D illustrate an example where the stepped surfaces 28 are arranged so that the outer peripheries of the stepped surfaces 28 are concentric in plan view, but other configurations may be employed as long as the stepped surfaces 28 are arranged such that the outer peripheries of the stepped surfaces 28 are separated from each other. For example, the stepped surfaces 28 may be arranged such that the center points of the outer peripheries of the stepped surfaces 28 are shifted in plan view.

Further, as the material of the substrate 25, for example, a material that causes light to be transmitted therethrough and has a refractive index of approximately 1.5 can be used. For example, a resin used as a material of a resin-made lens, such as a styrene-based resin and an acrylic-based resin, or an inorganic material having a refractive index close to 1.5, such as silicon oxide ($SiO_2$) and silicon nitride ($Si_3N$), can be employed. As the styrene-based resin, for example, polystyrene, an AS resin, or an ABS resin can be employed. Further, as the acrylic-based resin, for example, poly(meth)acrylonitrile, polymethyl(meth)acrylate, polyethyl(meth)acrylate, polybutyl(meth)acrylate, or polyacrylamide can be employed.

The coating layer 26 is formed on the back surface S7 side (light receiving surface side) of the substrate 25, and continuously covers the stepped structure 27 and the back surface S7 (surface on the light receiving surface side) of the substrate 25 on a periphery of the stepped structure 27. That is, the coating layer 26 is configured to cover the entire back surface S7, i.e., the entire surface having the stepped structure 27. The upper surface of the portion covering the stepped structure 27 is formed in a curved shape of the convex lens.

As described above, in the first embodiment, since the entire surface having the stepped structure 27 is covered with the coating layer 26 and the part of the coating layer 26 covering the stepped structure 27 is formed in a lens shape (in a convex lens shape), a convex microlens is formed by the stepped structure 27 and the coating layer 26.

Further, as the material of the coating layer 26, for example, a material that causes light to be transmitted therethrough and has a refractive index different from the refractive index of the material of the substrate 25 by ±10% or less of the refractive index of the material of the substrate 25 can be used. In particular, considering the reduction of the difference in a refractive index, it is favorable to use the same material as the material of the substrate 25. By reducing the difference between the refractive index of the coating layer 26 of incident light and the refractive index of the substrate 25, scattering and reflection of incident light on the interface between the coating layer 26 and the substrate 25 can be suppressed.

The wiring layer 21 is formed on the front surface S2 side of the substrate 2, and includes a wiring 32 stacked in a plurality of layers (three layers in FIG. 2) via an interlayer insulating film 31. A pixel transistor constituting the corresponding pixel 9 is driven via the wiring 32 of a plurality of layers formed in the wiring layer 21.

The support substrate 22 is formed on a surface of the wiring layer 21 opposed to the side facing the substrate 2. The support substrate 22 is a substrate for achieving the intensity of the substrate 2 in the production stage of the solid-state imaging device 1. For example, silicon (Si) can be used as the material of the support substrate 22.

In the solid-state imaging device 1 having the above-mentioned configuration, light is applied from the back surface side of the substrate 2 (the back surface S1 side of the light receiving layer 17), the applied light is transmitted through the wafer lens 19 and the color filter 18, and the transmitted light is photoelectrically converted by the photoelectric conversion unit 23, whereby signal charges are generated. Then, the generated signal charges are output as a pixel signal by the vertical signal line 11 shown in FIG. 1 formed of the wiring 32 via a pixel transistor formed on the front surface S2 side of the substrate 2.

1-3 Method of Producing Wafer Lens

Next, a method of producing the wafer lens 19 (optical element according to the first embodiment) of the solid-state imaging device 1 according to the first embodiment will be described. FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 16A, FIG. 16B, FIG. 17A, FIG. 17B, FIG. 18A, and FIG. 18B are plan views and cross-sectional views showing a production step of an optical element according to the first embodiment. FIG. 9A to FIG. 18B illustrate a case where the number of stages of the stepped surface 28 of the stepped structure 27 of the substrate 25 is three.

Figure 9A:
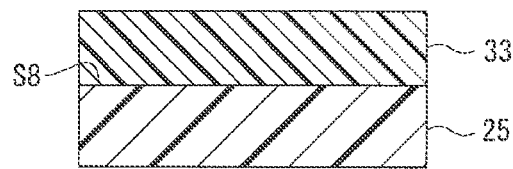
FIG. 9A is a diagram showing a flow of the step of producing the optical element in the solid-state imaging device according to the first embodiment, and is a cross-sectional view of the optical element taken along the line $A_2$-$A_2$ of FIG. 9B.
Figure 9B:
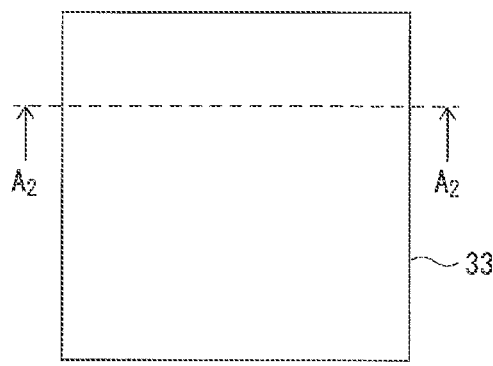
FIG. 9B is a diagram showing the flow of the step of producing the optical element in the solid-state imaging device according to the first embodiment, and is a plan view of the optical element in FIG. 9A.
Figure 10A:
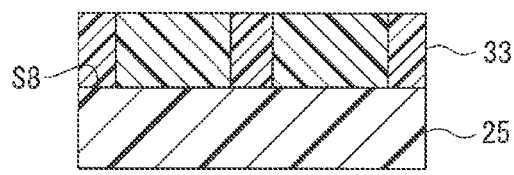
FIG. 10A is a diagram showing the flow of the step of producing the optical element in the solid-state imaging device according to the first embodiment, and is a cross-sectional view of the optical element taken along the line $A_3$-$A_3$ of FIG. 10B.
Figure 10B:
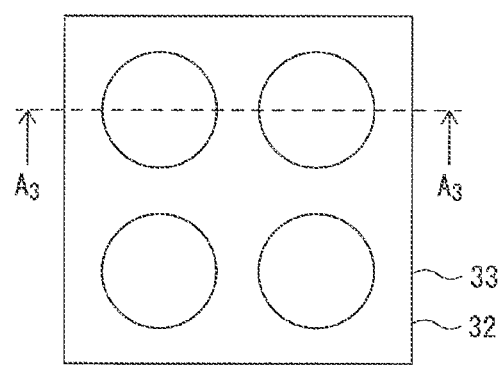
FIG. 10B is a diagram showing the flow of the step of producing the optical element in the solid-state imaging device according to the first embodiment, and is a plan view of the optical element in FIG. 10A.
Figure 11A:
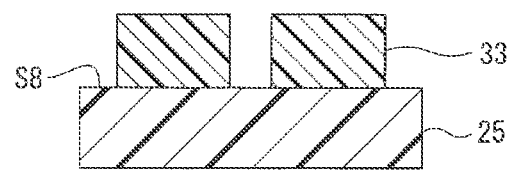
FIG. 11A is a diagram showing the flow of the step of producing the optical element in the solid-state imaging device according to the first embodiment, and is a cross-sectional view of the optical element taken along the line $A_4$-$A_4$ of FIG. 11B.
Figure 11B:
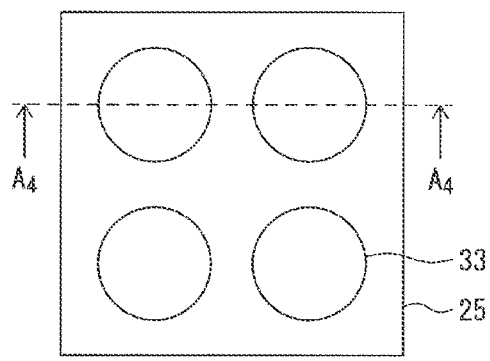
FIG. 11B is a diagram showing the flow of the step of producing the optical element in the solid-state imaging device according to the first embodiment, and is a plan view of the optical element in FIG. 11A.

First, as shown in FIG. 9A and FIG. 9B, a photoresist film 33 is applied to the entire back surface S8 of the substrate 25. Subsequently, the photoresist film 33 is exposed as shown in FIG. 10A and FIG. 10B, and the photoresist film 33 is developed as shown in FIG. 11A and FIG. 11B.

Figure 12A:
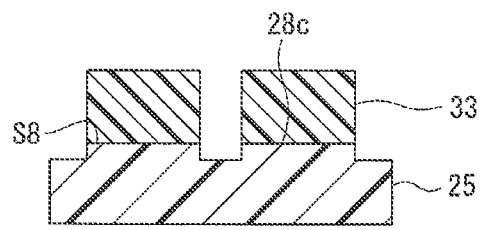
FIG. 12A is a diagram showing the flow of the step of producing the optical element in the solid-state imaging device according to the first embodiment, and is a cross-sectional view of the optical element taken along the line $A_5$-$A_5$ of FIG. 12B.
Figure 12B:
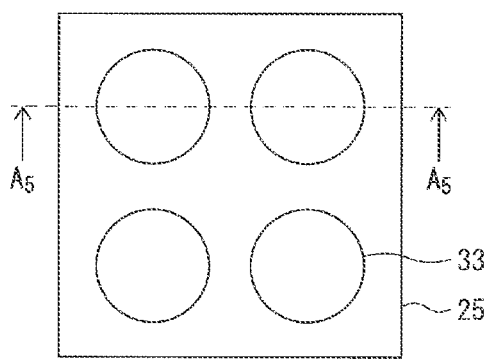
FIG. 12B is a diagram showing the flow of the step of producing the optical element in the solid-state imaging device according to the first embodiment, and is a plan view of the optical element in FIG. 12A.
Figure 13A:
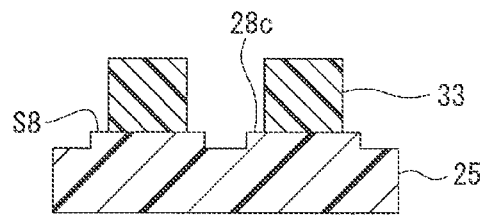
FIG. 13A is a diagram showing the flow of the step of producing the optical element in the solid-state imaging device according to the first embodiment, and is a cross-sectional view of the optical element taken along the line $A_5$-$A_5$ of FIG. 13B.
Figure 13B:
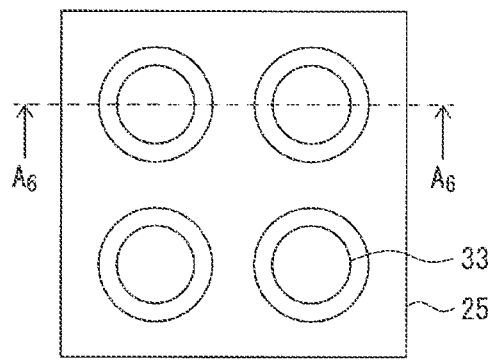
FIG. 13B is a diagram showing the flow of the step of producing the optical element in the solid-state imaging device according to the first embodiment, and is a plan view of the optical element in FIG. 13A.
Figure 14A:
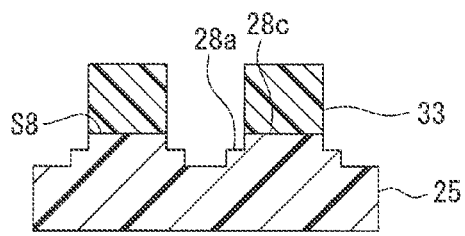
FIG. 14A is a diagram showing the flow of the step of producing the optical element in the solid-state imaging device according to the first embodiment, and is a cross-sectional view of the optical element taken along the line $A_7$-$A_7$ of FIG. 14B.
Figure 14B:
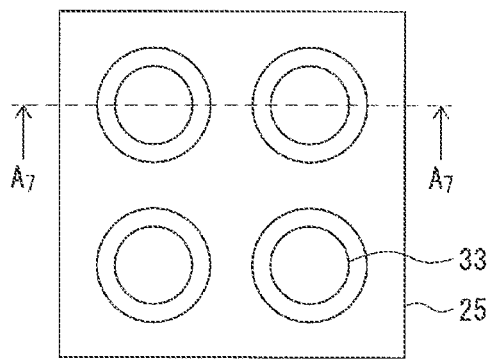
FIG. 14B is a diagram showing the flow of the step of producing the optical element in the solid-state imaging device according to the first embodiment, and is a plan view of the optical element in FIG. 14A.

Subsequently, as shown in FIG. 12A and FIG. 12B, the back surface S8 of the substrate 25 is etched using the developed photoresist film 33 as an etching mask, and a third-stage (uppermost part) stepped surface 28c of the stepped structure 27 is formed. Subsequently, the photoresist film 33 is slimmed as shown in FIGS. 13A and 13B, the third-stage stepped surface 28c is etched using the slimmed photoresist film 33 as an etching mask as shown in FIG. 14A and FIG. 14B, and a first-stage (lowermost part) stepped surface 28a of the stepped structure 27 is formed. Subsequently, slimming and etching are repeated to form a second-stage (intermediate part) stepped surface 28b of the stepped structure 27, and thus, the stepped structure 27 having the stepped surfaces 28a, 28b and 28c of three stages is formed.

Figure 15A:
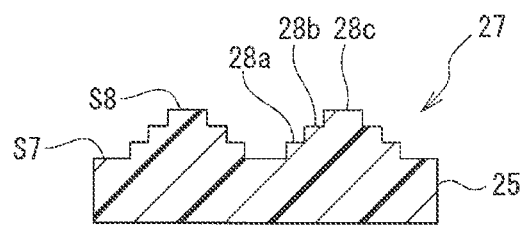
FIG. 15A is a diagram showing the flow of the step of producing the optical element in the solid-state imaging device according to the first embodiment, and is a cross-sectional view of the optical element taken along the line $A_8$-$A_8$ of FIG. 15B.
Figure 15B:
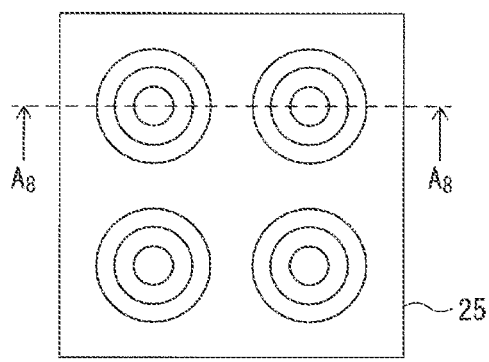
FIG. 15B is a diagram showing the flow of the step of producing the optical element in the solid-state imaging device according to the first embodiment, and is a plan view of the optical element in FIG. 15A.

Subsequently, as shown in FIG. 15A and FIG. 15B, the photoresist film 33 is removed from the back surface S8 of the substrate 25. As a result, the plurality of stepped structures 27 having the stepped surfaces 28a, 28b, and 28c of three stages regularly arranged in a two-dimensional array is formed on the back surface S7 of the substrate 25.

Figure 16A:
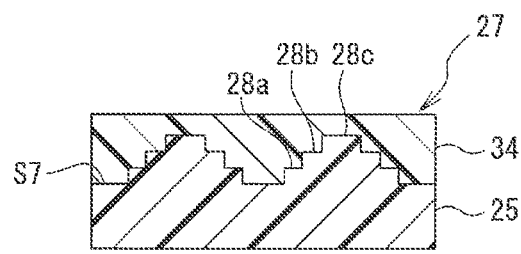
FIG. 16A is a diagram showing the flow of the step of producing the optical element in the solid-state imaging device according to the first embodiment, and is a cross-sectional view of the optical element taken along the line $A_9$-$A_9$ of FIG. 16B.
Figure 16B:
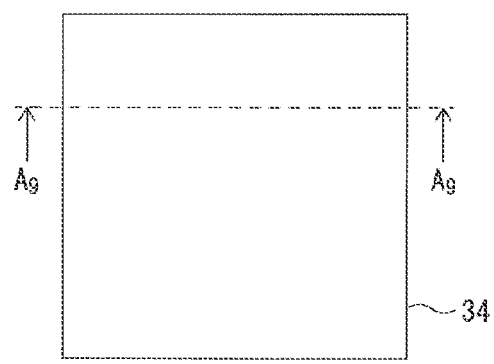
FIG. 16B is a diagram showing the flow of the step of producing the optical element in the solid-state imaging device according to the first embodiment, and is a plan view of the optical element in FIG. 16A.

Subsequently, as shown in FIG. 16A and FIG. 16B, a coating liquid 34 for forming the coating layer 26 is applied so as to cover the entire back surface S7 of the substrate 25, i.e., the entire surface having the stepped structure 27, and so that the liquid surface is horizontal. Regarding the thickness of the layer including the coating liquid 34, the part corresponding to the portion where the stepped structure 27 is not formed is the thickest, the part corresponding to the first-stage stepped surface 28a of the stepped structure 27 is the second thickest, the part corresponding to the second-stage stepped surface 28b of the stepped structure 27 is the third thickest, and the part corresponding to the third-stage stepped surface 28c of the stepped structure 27 is the thinnest. As the coating liquid 34, for example, a coating liquid obtained by dissolving a solute such as a styrene-based resin and an acrylic-based resin in a solvent can be employed. As a method of applying the coating liquid 34, for example, a spin coat method can be employed.

Figure 17A:
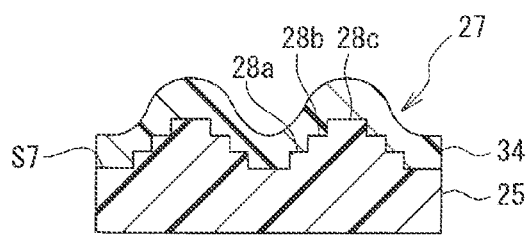
FIG. 17A is a diagram showing the flow of the step of producing the optical element in the solid-state imaging device according to the first embodiment, and is a cross-sectional view of the optical element taken along the line $A_{10}$-$A_{10}$ of FIG. 17B.
Figure 17B:
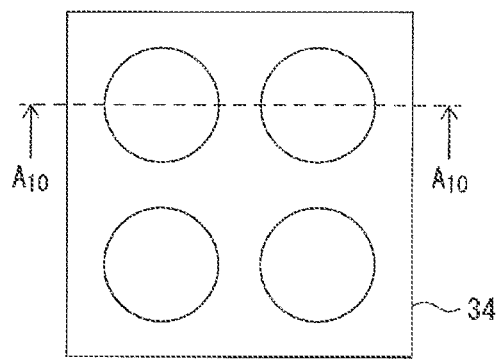
FIG. 17B is a diagram showing the flow of the step of producing the optical element in the solid-state imaging device according to the first embodiment, and is a plan view of the optical element in FIG. 17A.

Subsequently, as shown in FIG. 17A and FIG. 17B, the applied coating liquid 34 is dried. At this time, the solvent volatilizes and the thickness of the layer including the coating liquid 34 is reduced. Specifically, at an early stage of drying of the coating liquid 34, the front surface of the coating liquid 34 is flat and uniformly reduced in film thickness. However, as the drying of the coating liquid 34 proceeds, the solute concentration of the coating liquid 34 in a projecting portion becomes locally high due to the stepped structure 27 of the substrate 25. As a result, the evaporation rate of the solvent of the coating liquid 34 in the projecting portion becomes slow, and the front surface of the coating liquid 34 in a recessed portion is recessed. Due to this phenomenon, the amount of reduction in the thickness of the layer becomes larger where the thickness of the layer is thicker. In other words, the reduction amount of the part corresponding to the portion where the stepped structure 27 is not formed is the greatest, the reduction amount of the part corresponding to the first-stage stepped surface 28a of the stepped structure 27 is the second largest, the reduction amount of the part corresponding to the second-stage stepped surface 28b of the stepped structure 27 is the third largest, and the reduction amount of the part corresponding to the third-stage stepped surface 28c of the stepped structure 27 is the smallest. As a result, the coating layer 26 having a convex lens shape is formed in the portion covering the stepped structure 27.

Figure 18A:
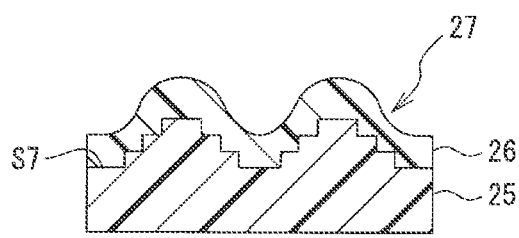
FIG. 18A is a diagram showing the flow of the step of producing the optical element in the solid-state imaging device according to the first embodiment, and is a cross-sectional view of the optical element taken along the line $A_{11}$-$A_{11}$ of FIG. 18B.
Figure 18B:
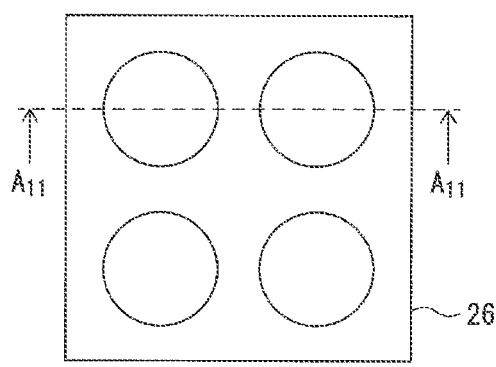
FIG. 18B is a diagram showing the flow of the step of producing the optical element in the solid-state imaging device according to the first embodiment, and is a plan view of the optical element in FIG. 18A.

Subsequently, as shown in FIG. 18A and FIG. 18B, UV-curing or baking is performed on the coating layer 26 having a convex lens shape so that the formed coating layer 26 (coating film) is a permanent film. As a result, the coating layer 26 is cured and the wafer lens 19 shown in FIG. 4 is completed. In the completed wafer lens 19, a lens height LH shown in FIG. 4 is less than or equal to the height H of the stepped structure 27. Further, a lens diameter LR is equal to or higher than the width W of the stepped structure 27 and equal to or lower than the pitch p of the stepped structure 27.

Figure 19A:
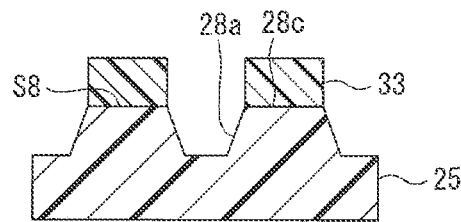
FIG. 19A is a diagram showing the flow of the step of producing the optical element in the solid-state imaging device according to the modified example, and is a cross-sectional view of the optical element taken along the line $A_{12}$-$A_{12}$ of FIG. 19B.
Figure 19B:
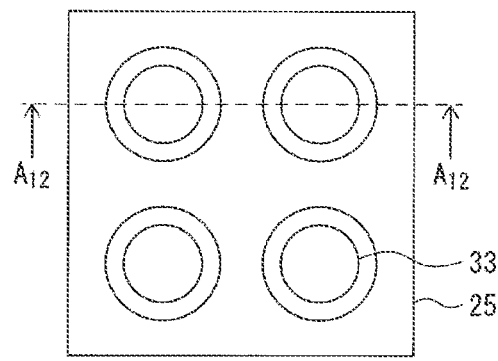
FIG. 19B is a diagram showing the flow of the step of producing the optical element in the solid-state imaging device according to the modified example, and is a plan view of the optical element in FIG. 19A.

Note that in the case where the side surfaces 29 and 30 are each an inclined surface, for example, a resist-receding method can be used. In the resist-receding method, as shown in FIG. 19A and FIG. 19B, when the substrate 25 is etched, the photoresist film 33 is also slowly etched using an etching gas mixed with an $O_2$ gas or the like. Then, the photoresist film 33 is gradually reduced, and the region to be etched in the substrate 25 is gradually widened. As a result, it is possible to form a portion of the substrate 25 where the etching time is continuously changed, and form an inclined surface on the side surfaces 29 and 30.

As described above, in the wafer lens 19 (optical element) according to the first embodiment, the substrate 25 is provided, the stepped structure 27 being formed on one surface (the back surface S7) of the substrate 25, the stepped structure 27 having the stepped surface 28 having a different height from the back surface S7. In addition, the coating layer 26 that continuously covers the stepped structure 27 and the back surface S7 on a periphery of the stepped structure 27 and causes light to be transmitted therethrough is provided. Therefore, various shapes can be realized in accordance with the shape of the stepped structure 27, and the wafer lens 19 with a high flexibility of designing can be provided.

Further, in the wafer lens 19 (optical element) according to the first embodiment, the number of stages of the stepped surface 28 has been set to two or more. Alternatively, in the case where the number of stages of the stepped surface 28 is one, an inclined surface or a curved surface inclined with respect to the normal direction of the back surface S7 (surface on the light receiving surface side) of the substrate 25 has been provided as the side surface 29 of the stepped structure 27. Therefore, the upper surface of the coating layer 26 can be formed in a smooth curved surface shape, and the wafer lens 19 having a large curvature can be formed. Therefore, it can be made suitable for further advancing fine pixelization of a CMOS image sensor.

Note that the effects described herein are merely illustrative and not restrictive, and may have other effects.

Further, the method of producing the optical element according to the first embodiment includes: a step of forming the stepped structure 27 on the substrate 25; a step of applying the coating liquid 34 to the substrate 25 on which the stepped structure 27 has been formed; and a step of drying the coating liquid 34 so that the coating layer 26 that continuously covers the stepped structure 27 and the surface (the back surface S7) of the substrate 25 on a periphery of the stepped structure 27 and causes light to be transmitted therethrough is formed. Therefore, since the curved surface can be formed only by the application operation, the existing equipment can be used, and the cost can be suppressed. Therefore, it is possible to provide a method of producing an optical element capable of reducing production costs.

Further, in the method of producing the optical element according to the first embodiment, the front surface of the coating layer 26 can have a gradual curvature portion and the front surface of the coating layer 26 can be varied with high controllability in accordance with the shape of the stepped structure 27. Further, the stepped structure 27 can be designed to achieve a desired shape of the wafer lens 19 by simulating the application and drying of the coating liquid 34.

Incidentally, for example, as described in Patent Literature 1, in the thermal reflow method of forming a lens by forming a lens forming pattern layer on each of the upper surfaces of the respective stepped structures and then thermally reflowing the lens forming pattern layer, since the curved surface structure is formed by utilizing the front surface tension, only a convex shape can be formed, a concave shape cannot be formed, and thus, the flexibility of designing is reduced.

In contrast, in the method of producing the optical element according to the first embodiment, since any of a projecting shape and a recessed shape can be formed by using the shape of the stepped structure 27, it is possible to improve the flexibility of designing. The shape of the optical element can be controlled by controlling the structure (shape and height) of steps and the drying process of the drying rate, and adjusting the physical property values of the coating material, such as the pitch, width, number of steps, inclination angle, curvature, drying rate of the coating liquid, diffusivity, and concentration. Therefore, it is possible to form a curved surface having desired curvature distribution. In addition, for example, a curved surface can be separately formed for each of the pixels 9 by separately forming a structure of a step or the like for each of the pixels 9.

Further, for example, in the thermal reflow method, the material of the lens forming pattern layer needs to have not only photosensitive but also resolving property and thermal reflow property enabling formation of a pattern, and therefore, there are many restrictions on the material.

In contrast, in the method of producing the optical element according to the first embodiment, the photoresist film 33 does not need to have resolving property or thermal reflow property, and less restrictions on the material of the photoresist film 33 are required.

Further, for example, in the thermal reflow method, since the lens forming pattern layer is heated, a substrate needs to have heat resistance. Further, as described in, for example, Japanese Patent Application Laid-open No. 2005-349708, in a method of forming a lens by forming a water-repellent film having an opening region on a substrate and then dropping a liquid member corresponding to a lens shape into the opening region, the substrate needs to have hydrophilicity.

In contrast, in the method of producing the optical element according to the first embodiment, the substrate 25 does not need to have heat resistance or hydrophilicity, and less restrictions on the material of the substrate 25 of the wafer lens 19 (optical element) are required.

Figure 20:
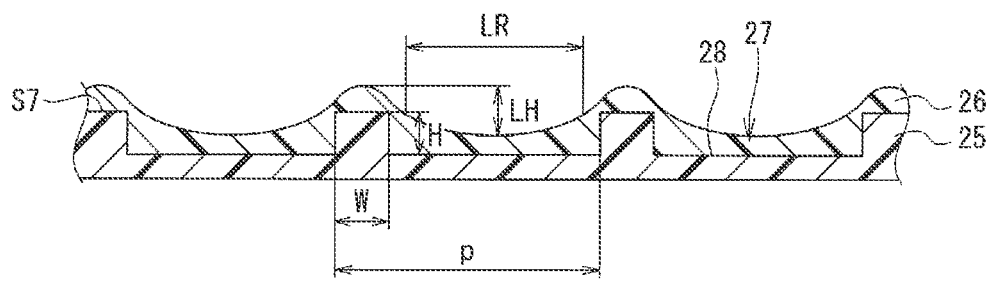
FIG. 20 is a diagram showing an enlarged planar configuration of a wafer lens in a solid-state imaging device according to a second embodiment of the present disclosure.

2. Second Embodiment: Solid-State Imaging Device 2-1 Configuration of Main Parts Next, a solid-state imaging device according to a second embodiment of the present disclosure will be described. The entire configuration of the solid-state imaging device according to the second embodiment and the cross-sectional configuration of the pixel region 3 are similar to those in FIG. 1 and FIG. 2, and therefore, illustration thereof is omitted. FIG. 20 is a cross-sectional configuration diagram of main parts of the solid-state imaging device 1 according to the second embodiment. In FIG. 20, portions corresponding to those in FIG. 4 are denoted by the same reference symbols, and repetitive description thereof is omitted.

The solid-state imaging device 1 according to the second embodiment is different from the first embodiment in the configuration of the wafer lens 19. In the second embodiment, as shown in FIG. 20, the stepped structure 27 is a recessed portion formed from the back surface S7 side of the substrate 25 toward the depth direction. Further, the coating layer 26 is configured to continuously cover the bottom surface and the inner wall surface of the recessed portion and the back surface S7 of the substrate 25 on a periphery of the recessed portion. The upper surface of the portion covering the bottom surface and the inner wall surface of the recessed portion is formed in a curved shape of the concave lens.

2-2 Method of Producing Wafer Lens

Next, a method of producing the wafer lens 19 (optical element according to the second embodiment) of the solid-state imaging device 1 according to the second embodiment will be described. FIG. 21A, FIG. 21B, FIG. 22A, FIG. 22B, FIG. 23A, FIG. 23B, FIG. 24A, FIG. 24B, FIG. 25A, FIG. 25B, FIG. 26A, FIG. 26B, FIG. 27A, FIG. 27B, FIG. 28A, FIG. 28B, FIG. 29A, FIG. 29B, FIG. 30A, and FIG. 30B are plan views and cross-sectional views showing a production step of the optical element according to the second embodiment. FIG. 21A to FIG. 30B illustrate a case where the number of stages of the stepped surface 28 of the stepped structure 27 of the substrate 25 is three.

Figure 21A:
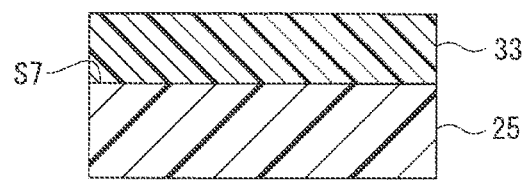
FIG. 21A is a diagram showing a flow of a step of producing the optical element in the solid-state imaging device according to the second embodiment, and is a cross-sectional view of the optical element taken along the line $A_{13}$-$A_{13}$ of FIG. 21B.
Figure 21B:
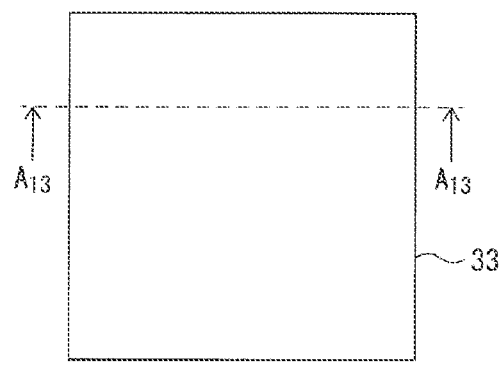
FIG. 21B is a diagram showing the flow of the step of producing the optical element in the solid-state imaging device according to the second embodiment, and is a plan view of the optical element in FIG. 21A.
Figure 22A:
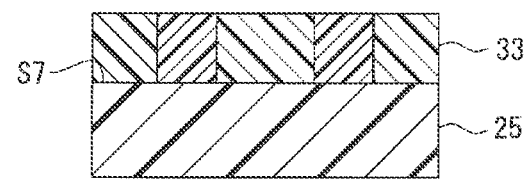
FIG. 22A is a diagram showing the flow of the step of producing the optical element in the solid-state imaging device according to the second embodiment, and is a cross-sectional view of the optical element taken along the line $A_{14}$-$A_{14}$ of FIG. 22B.
Figure 22B:
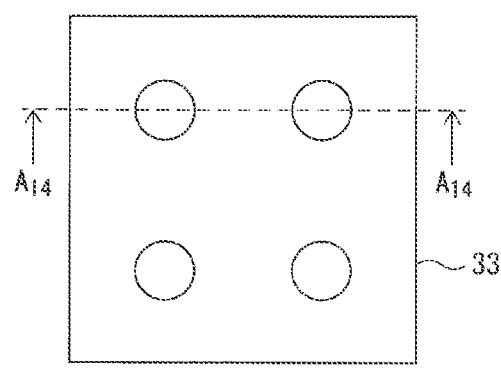
FIG. 22B is a diagram showing the flow of the step of producing the optical element in the solid-state imaging device according to the second embodiment, and is a plan view of the optical element in FIG. 22A.
Figure 23A:
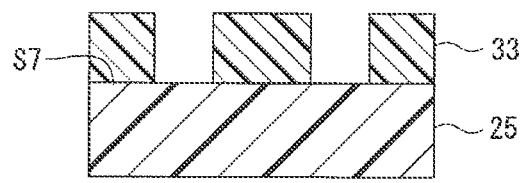
FIG. 23A is a diagram showing the flow of the step of producing the optical element in the solid-state imaging device according to the second embodiment, and is a cross-sectional view of the optical element taken along the line $A_{15}$-$A_{15}$ of FIG. 23B.
Figure 23B:
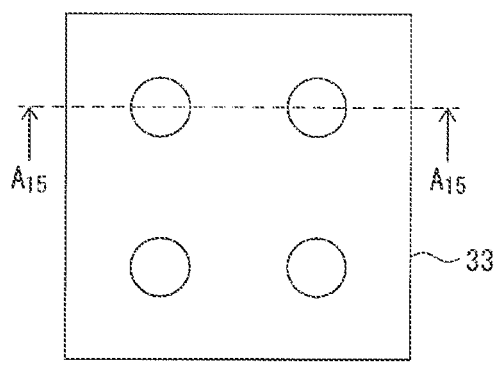
FIG. 23B is a diagram showing the flow of the step of producing the optical element in the solid-state imaging device according to the second embodiment, and is a plan view of the optical element in FIG. 23A.

First, as shown in FIG. 21A and FIG. 21B, the photoresist film 33 is applied to the entire back surface S7 of the substrate 25. Subsequently, the photoresist film 33 is exposed as shown in FIG. 22A and FIG. 22B, and the photoresist film 33 is developed as shown in FIG. 23A and FIG. 23B.

Figure 24A:
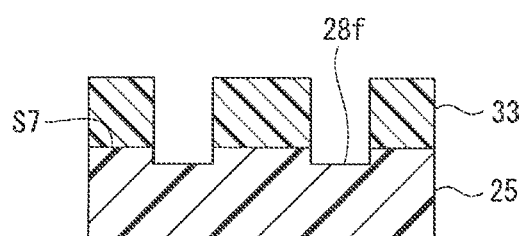
FIG. 24A is a diagram showing the flow of the step of producing the optical element in the solid-state imaging device according to the second embodiment, and is a cross-sectional view of the optical element taken along the line $A_{16}$-$A_{16}$ of FIG. 24B.
Figure 24B:
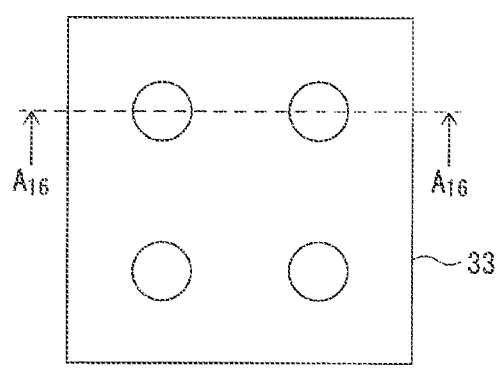
FIG. 24B is a diagram showing the flow of the step of producing the optical element in the solid-state imaging device according to the second embodiment, and is a plan view of the optical element in FIG. 24A.
Figure 25A:
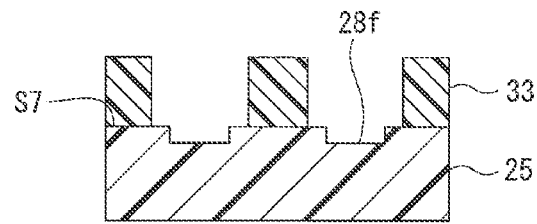
FIG. 25A is a diagram showing the flow of the step of producing the optical element in the solid-state imaging device according to the second embodiment, and is a cross-sectional view of the optical element taken along the line $A_{17}$-$A_{17}$ of FIG. 25B.
Figure 25B:
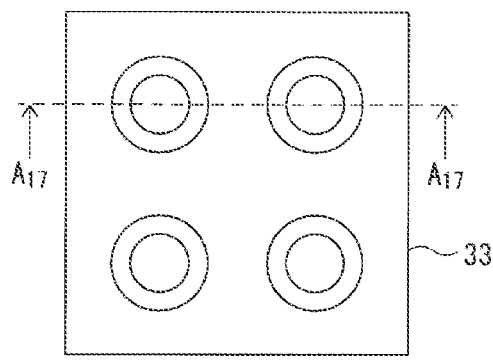
FIG. 25B is a diagram showing the flow of the step of producing the optical element in the solid-state imaging device according to the second embodiment, and is a plan view of the optical element in FIG. 25A.
Figure 26A:
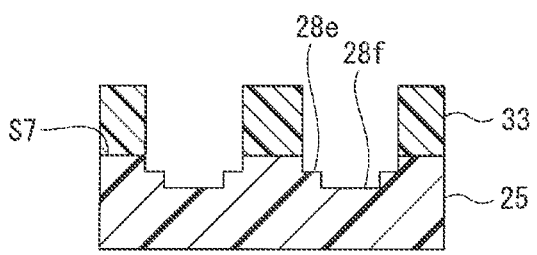
FIG. 26A is a diagram showing the flow of the step of producing the optical element in the solid-state imaging device according to the second embodiment, and is a cross-sectional view of the optical element taken along the line $A_{18}$-$A_{18}$ of FIG. 26B.
Figure 26B:
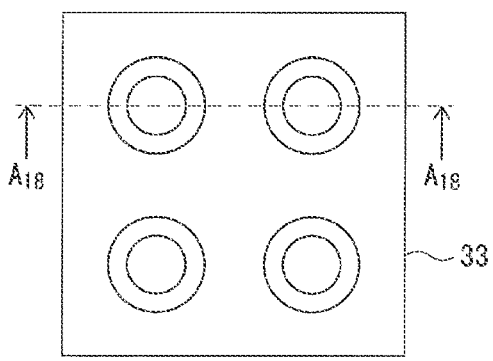
FIG. 26B is a diagram showing the flow of the step of producing the optical element in the solid-state imaging device according to the second embodiment, and is a plan view of the optical element in FIG. 26A.

Subsequently, as shown in FIG. 24A and FIG. 24B, the back surface S7 of the substrate 25 is etched using the developed photoresist film 33 as an etching mask to form a third-stage (lowermost part) stepped surface 28f of the stepped structure 27. Subsequently, the photoresist film 33 is slimmed as shown in FIG. 25A and FIG. 25B, the back surface S7 of the substrate 25 is etched using the slimmed photoresist film 33 as an etching mask as shown in FIG. 26A and FIG. 26B, and a second-stage (intermediate part) stepped surface 28e of the stepped structure 27 is formed. Subsequently, slimming and etching are repeated to form a first-stage (uppermost part) stepped surface 28d of the stepped structure 27, and the stepped structure 27 having the stepped surfaces 28d, 28e, and 28f of three stages is formed.

Figure 27A:
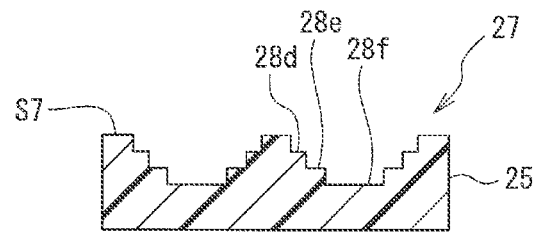
FIG. 27A is a diagram showing the flow of the step of producing the optical element in the solid-state imaging device according to the second embodiment, and is a cross-sectional view of the optical element taken along the line $A_{19}$-$A_{19}$ of FIG. 27B.
Figure 27B:
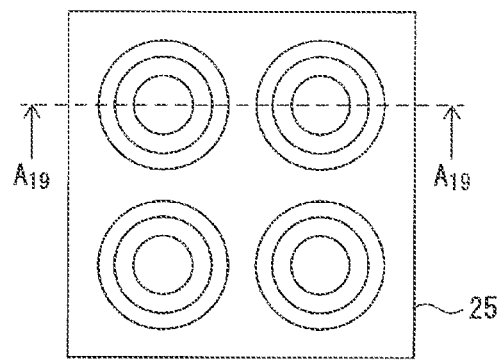
FIG. 27B is a diagram showing the flow of the step of producing the optical element in the solid-state imaging device according to the second embodiment, and is a plan view of the optical element in FIG. 27A.

Subsequently, as shown in FIG. 27A and FIG. 27B, the photoresist film 33 is removed from the back surface S7 of the substrate 25. As a result, the plurality of stepped structures 27 having the stepped surfaces 28d, 28e, and 28f of three stages regularly arranged in a two-dimensional array is formed on the back surface S7 of the substrate 25.

Figure 28A:
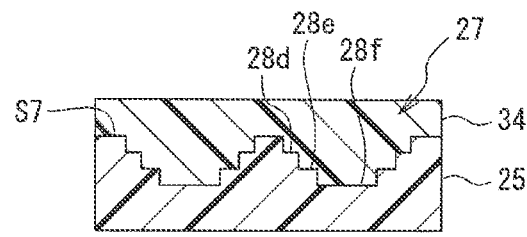
FIG. 28A is a diagram showing the flow of the step of producing the optical element in the solid-state imaging device according to the second embodiment, and is a cross-sectional view of the optical element taken along the line $A_{20}$-$A_{20}$ of FIG. 28B.
Figure 28B:
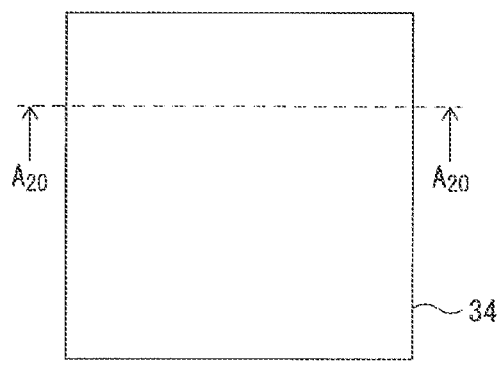
FIG. 28B is a diagram showing the flow of the step of producing the optical element in the solid-state imaging device according to the second embodiment, and is a plan view of the optical element in FIG. 28B.

Subsequently, as shown in FIG. 28A and FIG. 28B, the coating liquid 34 for forming the coating layer 26 is applied so as to cover the entire back surface S7 of the substrate 25, i.e., the entire surface having the stepped structure 27, and so that the liquid surface is horizontal. Regarding the thickness of the layer including the coating liquid 34, the part corresponding to the third-stage stepped surface 28f of the stepped structure 27 is the thickest, the part corresponding to the second-stage stepped surface 28e of the stepped structure 27 is the second thickest, the part corresponding to the first-stage stepped surface 28d of the stepped structure 27 is the third thickest, and the part corresponding to the portion where the stepped structure 27 is not formed is the thinnest. As the coating liquid 34, for example, a coating liquid obtained by dissolving a styrene-based resin or an acrylic-based resin in an appropriate solvent can be employed. As a method of applying the coating liquid 34, for example, a spin coat method can be employed.

Figure 29A:
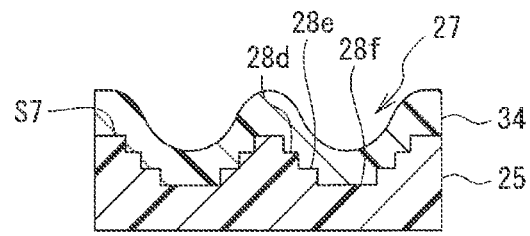
FIG. 29A is a diagram showing the flow of the step of producing the optical element in the solid-state imaging device according to the second embodiment, and is a cross-sectional view of the optical element taken along the line $A_{21}$-$A_{21}$ of FIG. 29B.
Figure 29B:
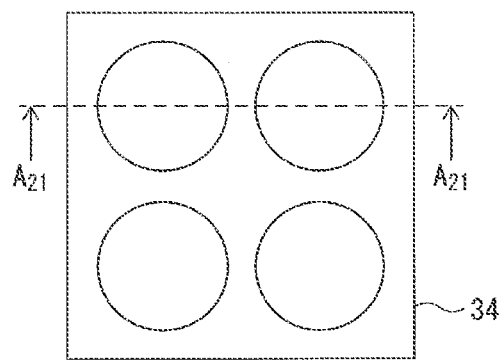
FIG. 29B is a diagram showing the flow of the step of producing the optical element in the solid-state imaging device according to the second embodiment, and is a plan view of the optical element in FIG. 29A.

Subsequently, as shown in FIG. 29A and FIG. 29B, the applied coating liquid 34 is dried. At this time, the solvent volatilizes and the thickness of the layer including the coating liquid 34 is reduced. Specifically, at an early stage of drying of the coating liquid 34, the front surface of the coating liquid 34 is flat and uniformly reduced in film thickness. However, as the drying of the coating liquid 34 proceeds, the solute concentration of the coating liquid 34 in the recessed portion becomes locally low due to the stepped structure 27 of the substrate 25. As a result, the evaporation rate of the solvent of the coating liquid 34 is increased in the recessed portion, and the front surface of the coating liquid 34 in the recessed portion is recessed. Due to this phenomenon, the amount of reduction in the thickness of the layer becomes larger where the thickness of the layer is thicker. That is, the reduction amount of the part corresponding to the third-stage stepped surface 28f of the stepped structure 27 is the greatest, the reduction amount of the part corresponding to the second-stage stepped surface 28e of the stepped structure 27 is the second largest, the reduction amount of the part corresponding to the first-stage stepped surface 28d of the stepped structure 27 is the third largest, and the reduction amount of the part corresponding to the portion where the stepped structure 27 is not formed is the smallest. As a result, the coating layer 26 having a concave lens shape is formed in the portion covering the stepped structure 27.

Figure 30A:
FIG. 30A is a diagram showing the flow of the step of producing the optical element in the solid-state imaging device according to the second embodiment, and is a cross-sectional view of the optical element taken along the line $A_{22}$-$A_{22}$ of FIG. 30B.
Figure 30B:
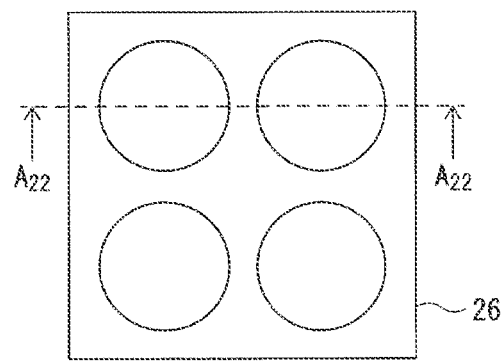
FIG. 30B is a diagram showing the flow of the step of producing the optical element in the solid-state imaging device according to the second embodiment, and is a plan view of the optical element in FIG. 30A.

Subsequently, as shown in FIG. 30A and FIG. 30B, the coating layer 26 having a concave lens shape is UV-cured or baked so that the formed coating layer 26 (coating film) is a permanent film. As a result, the coating layer 26 is cured and the wafer lens 19 shown in FIG. 20 is completed. In the completed wafer lens 19, the lens height LH shown in FIG. 20 is less than or equal to the height of the stepped structure 27. Further, the lens diameter LR is equal to or higher than the width W of the stepped structure 27 and equal to or lower than the pitch p of the stepped structure 27.

As described above, in the wafer lens 19 (optical element) according to the second embodiment, the substrate 25 is provided, the stepped structure 27 being formed on one surface (the back surface S7) of the substrate 25, the stepped structure 27 having the stepped surface 28 having a different height from the back surface S7. In addition, the coating layer 26 that continuously covers the stepped structure 27 and the back surface S7 on a periphery of the stepped structure 27 and causes light to be transmitted therethrough is provided. Therefore, various shapes can be realized in accordance with the shape of the stepped structure 27, and the wafer lens 19 with a high flexibility of designing can be provided.

3. Third Embodiment: Solid-State Imaging Device 3-1 Configuration of Main Parts

Figure 31:
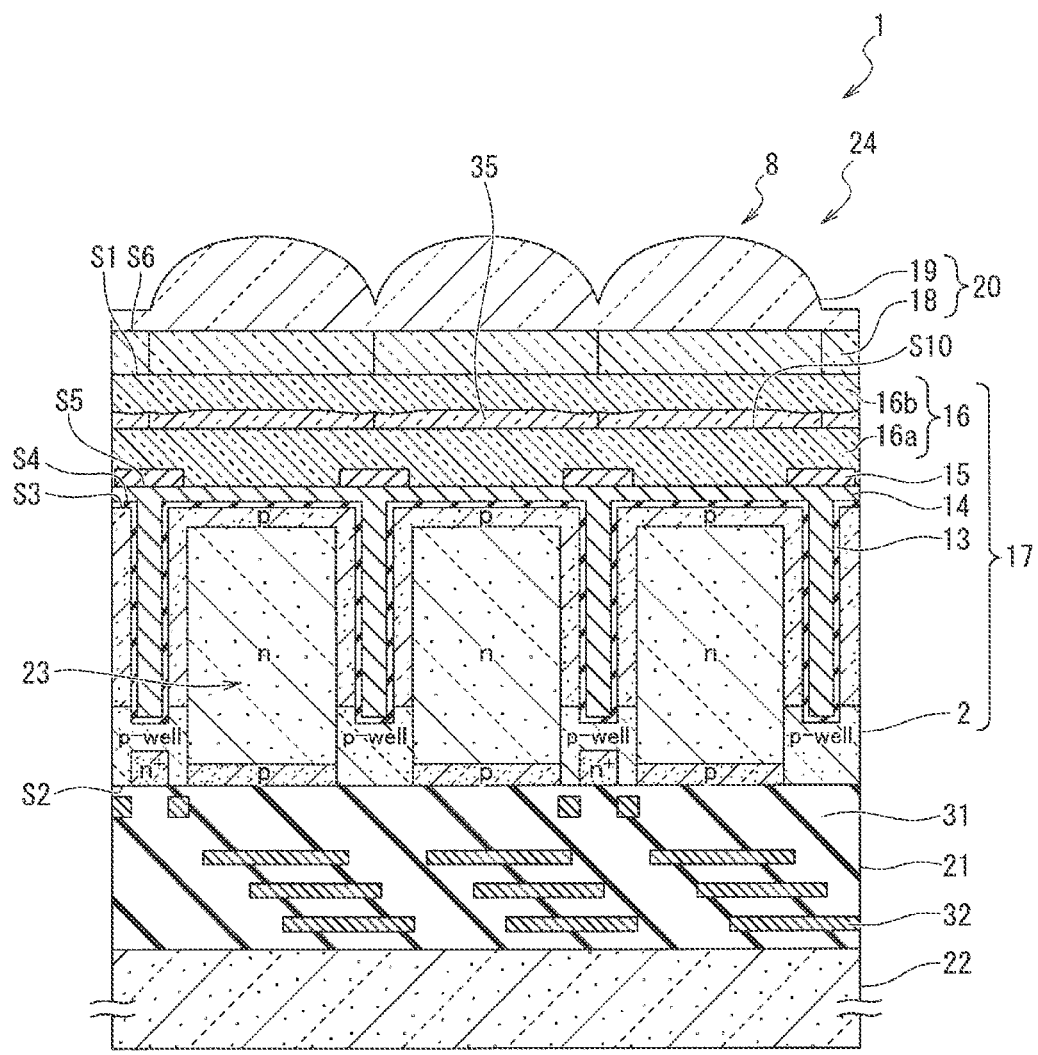
FIG. 31 is a diagram showing an enlarged planar configuration of a wafer lens in a solid-state imaging device according to a third embodiment of the present disclosure.

Next, a solid-state imaging device according to a third embodiment of the present disclosure will be described. Since the entire configuration of the solid-state imaging device according to the third embodiment is similar to that in FIG. 1, illustration thereof is omitted. FIG. 31 is a diagram showing a cross-sectional configuration of the pixel region 3 according to the third embodiment. In FIG. 31, portions corresponding to those in FIG. 2 are denoted by the same reference symbols, and repetitive description thereof is omitted.

As shown in FIG. 31, the solid-state imaging device 1 according to the third embodiment is different from the first embodiment in that a complicated aspherical lens having a large curvature in the center portion and a gradual curvature in the outer periphery portion is realized by combining the wafer lens 19 having a spherical lens shape and a large curvature in the center portion and a correction lens 35 having a gradual curvature in the outer periphery portion to obtain a lens group. That is, the correction lens 35 is configured to receive the light that has been transmitted through the wafer lens 19.

The correction lenses 35 are formed in the flattening film 16 between the insulating film 14 and the color filter 18 corresponding to the pixels 9. Thus, the correction lenses 35 form a correction lens array (optical element array) regularly arranged in a two-dimensional array. The correction lens 35 is optically designed to correct the aberrations caused by the wafer lens 19. Examples of the aberrations caused by the wafer lens 19 include Seidel five aberrations (spherical aberration, astigmatism, coma aberration, field curvature aberration, and distortion aberration) and chromatic aberrations (magnification chromatic aberration and on-axis chromatic aberration).

Here, in the case where the wafer lens 19 is a lens that produces a magnification chromatic aberration, when light enters the wafer lens 19 obliquely to the optical axis, the imaging position of the light by the wafer lens 19 is a different position in the plane perpendicular to the optical axis for each color (wavelength range) included in the incident light. Further, in the case where the wafer lens 19 is a lens that produces an on-axis chromatic aberration, when light enters the wafer lens 19 in parallel with the optical axis, the imaging position of the light by the wafer lens 19 is a different position on the optical axis for each color (wavelength range) included in the incident light. Therefore, in accordance with the wavelength range (color) of the light transmitted through the color filter 18 corresponding to the wafer lens 19, there is a possibility that a part of the light by the wafer lens 19 deviates from the photoelectric conversion unit 23 corresponding to the wafer lens 19 and enters the light-shielding film 15 on a periphery of the photoelectric conversion unit 23 or a different photoelectric conversion unit 23. Then, when a part of the light enters the light-shielding film 15, there is a possibility that the sensitivity of the photoelectric conversion unit 23 corresponding to the wafer lens 19 is reduced. Further, when a part of the light enters the different photoelectric conversion unit 23, there is a possibility that not only the sensitivity of the photoelectric conversion unit 23 corresponding to the wafer lens 19 is reduced but also color mixing occurs in the photoelectric conversion unit 23.

Figure 32A:
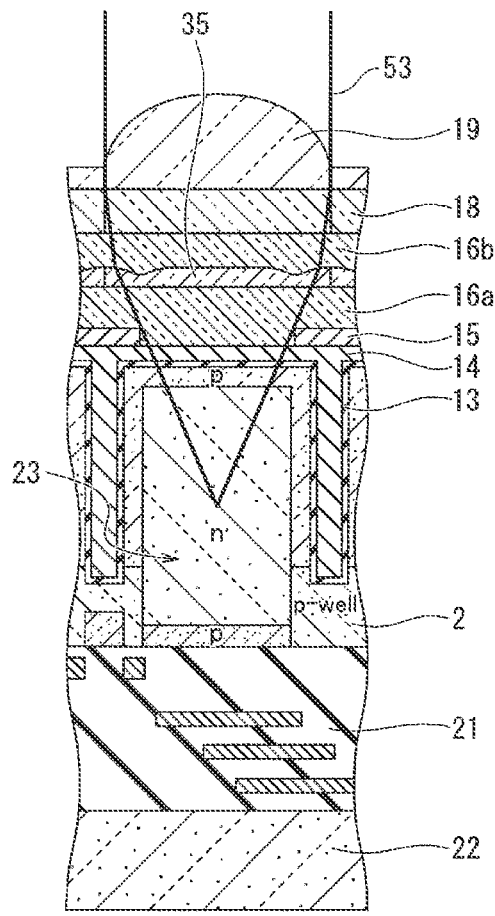
FIG. 32A is a diagram showing a collection state of light by a correction lens disposed in a pixel corresponding to a color filter that causes light having a red wavelength to be transmitted therethrough.
Figure 32B:
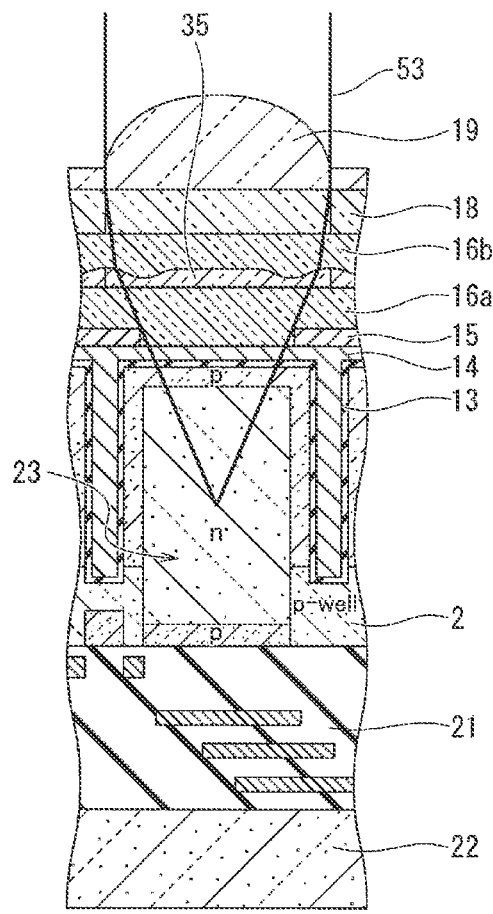
FIG. 32B is a diagram showing a collection state of light by a correction lens disposed in a pixel corresponding to a color filter that causes light having a green wavelength to be transmitted therethrough.
Figure 32C:
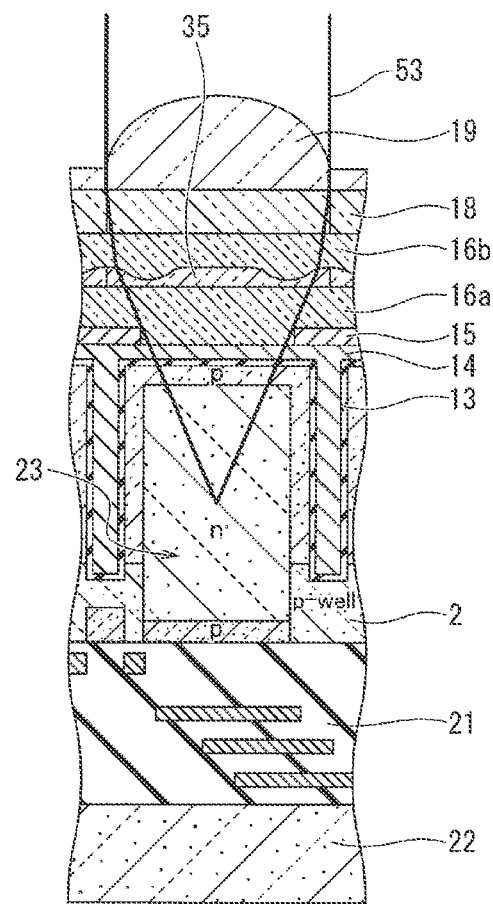
FIG. 32C is a diagram showing a collection state of light by a correction lens disposed in a pixel corresponding to a color filter that causes light having a blue wavelength to be transmitted therethrough.

Therefore, in the case where the correction lens 35 is used as a lens for correcting chromatic aberrations, the correction lens 35 is designed so that substantially all of the light that has entered the wafer lens 19 enter the photoelectric conversion unit 23 corresponding to the wafer lens 19, as shown in FIG. 32A, FIG. 32B, and FIG. 32C. That is, the correction lens 35 is configured to increase the light collection ratio and the accuracy of the imaging point of the aspherical lens realized by combining the wafer lens 19 and the correction lens 35. FIG. 32A illustrates the collection state of a light 53 by the correction lens 35 (hereinafter, referred to also as the "red correction lens") disposed in the pixel 9 including the color filter 18 that causes light of red wavelengths to be transmitted therethrough. FIG. 32B illustrates the collection state of the light 53 by the correction lens 35 (hereinafter, referred to also as the "green correction lens") disposed in the pixel 9 including the color filter 18 that causes light of green wavelengths to be transmitted therethrough. FIG. 32C illustrates the collection state of the light 53 by the correction lens 35 (hereinafter, referred to also as the "blue correction lens") disposed in the pixel 9 including the color filter 18 that causes light of blue wavelengths to be transmitted therethrough.

By correcting the chromatic aberration caused by the wafer lens 19, it is possible to prevent the sensitivity of the photoelectric conversion unit 23 from being reduced and prevent the color mixing from occurring. In addition, since substantially all of the light that has entered the wafer lens 19 enter the photoelectric conversion unit 23, the inter-pixel light shielding region between the photoelectric conversion units 23 can be reduced, the size of the photoelectric conversion unit 23 can be increased, and the sensitivity of the photoelectric conversion unit 23 can also be improved.

Figure 33A:
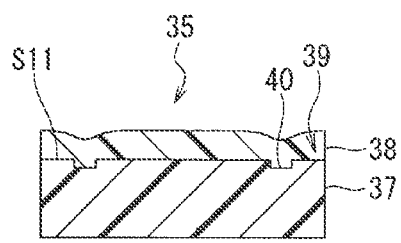
FIG. 33A is a cross-sectional view of a correction lens disposed in a pixel including a color filter that causes light having a red wavelength to be transmitted therethrough, which is taken along the line $A_{23}$-$A_{23}$ of FIG. 33B.
Figure 33B:
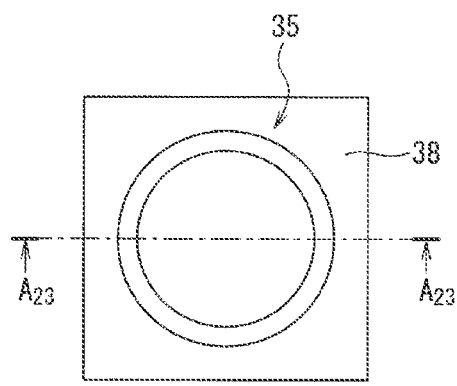
FIG. 33B is a plan view of the correction lens disposed in the pixel including the color filter that causes light having a red wavelength to be transmitted therethrough in FIG. 33A.
Figure 34A:
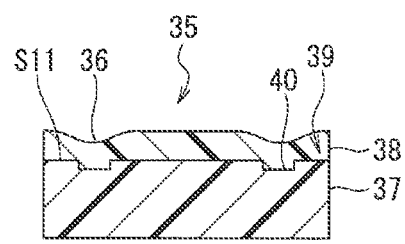
FIG. 34A is a cross-sectional view of a correction lens disposed in a pixel including a color filter that causes light having a green wavelength to be transmitted therethrough, which is taken along the line $A_{24}$-$A_{24}$ of FIG. 33B.
Figure 34B:
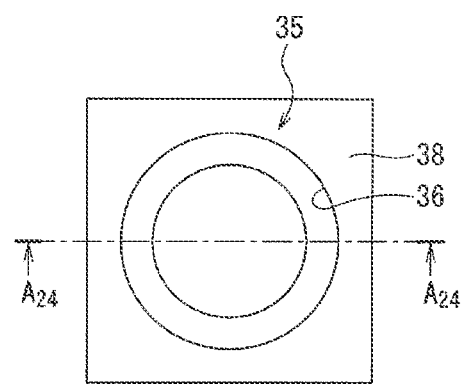
FIG. 34B is a plan view of the correction lens disposed in the pixel including the color filter that causes light having a green wavelength to be transmitted therethrough in FIG. 33A.
Figure 35A:
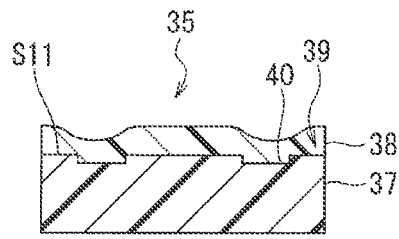
FIG. 35A is a cross-sectional view of a correction lens disposed in a pixel including a color filter that causes light having a blue wavelength to be transmitted therethrough, which is taken along the line $A_{25}$-$A_{25}$ of FIG. 35B.
Figure 35B:
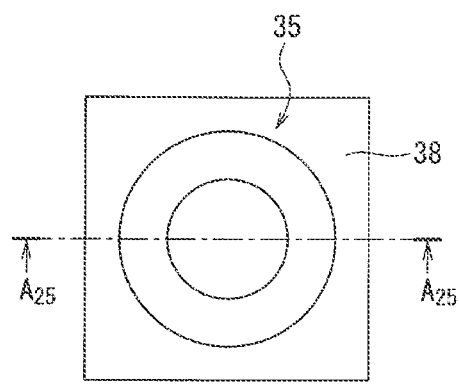
FIG. 35B is a plan view of the correction lens disposed in the pixel including the color filter that causes light having a blue wavelength to be transmitted therethrough in FIG. 35A.

Further, as the correction lens 35 for correcting chromatic aberrations such as a magnification chromatic aberration and an on-axis chromatic aberration, for example, a lens having an annular recessed portion 36, which has an annular shape along the outer periphery portion of the correction lens 35 in plan view can be used as shown in FIG. 33A, FIG. 33B, FIG. 34A, FIG. 34B, FIG. 35A, and FIG. 35B. FIG. 33A and FIG. 33B illustrate a red correction lens, FIG. 34A and FIG. 34B illustrate a green correction lens, and FIG. 35A and FIG. 35B illustrate a blue correction lens.

Further, the width of the annular recessed portion 36 is smaller in the order of, for example, the width of the annular recessed portion 36 of the red correction lens<the width of the annular recessed portion 36 of the green correction lens<the width of the annular recessed portion 36 of the blue correction lens. Further, the diameter of the annular recessed portion 36 is smaller in the order of, for example, the diameter of the annular recessed portion 36 of the blue correction lens<the diameter of the annular recessed portion 36 of the green correction lens<the diameter of the annular recessed portion 36 of the blue correction lens. As the diameter of the annular recessed portion 36, for example, the average value of the inner diameter and the outer diameter of the annular recessed portion 36 can be used.

Note that in the third embodiment, a thermal reflow method can also be employed as a method of forming the wafer lens 19. By employing the thermal reflow method, when the wafer lens 19 is formed to have a spherical lens, the stepped structure 27 of the wafer lens 19 only needs to have a relatively simple shape. Therefore, the labor required for forming the stepped structure 27 can be reduced, and the production costs of the wafer lens 19 can be reduced.

Figure 36:
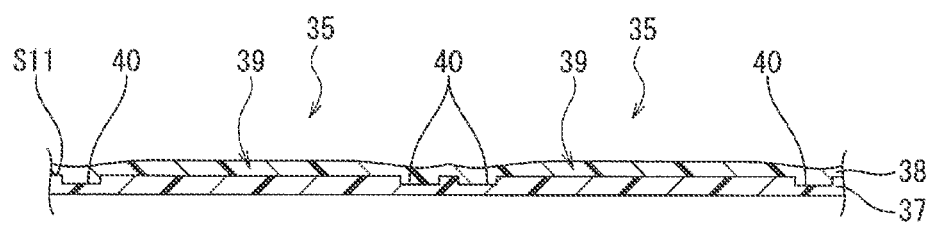
FIG. 36 is a diagram showing an enlarged stepped-surface configuration of a substrate.

Next, a detailed structure of the correction lens 35 in FIG. 31 will be described. FIG. 36 is a diagram showing a cross-sectional configuration of the correction lens 35.

As shown in FIG. 36, the correction lens 35 includes a substrate 37 and a coating layer 38.

The substrate 37 is formed on a back surface S10 side (surface on the color filter 18 side) of a portion 16a on the insulating film 14 side of the flattening film 16, and includes a plurality of stepped structures 39, which is a recessed portion formed from a back surface S11 side (surface on the color filter 18 side) of the substrate 37 toward the depth direction, similarly to the substrate 25 according to the second embodiment. Each of the stepped structures 39 is formed corresponding to each of the pixels 9 and has a stepped surface 40 of one or more stages. As the stepped surface 40, for example, a surface having a height different from that of the back surface S11 of the substrate 37 can be used. For example, a surface parallel to the back surface S11 of the substrate 37 can be used. FIG. 36 illustrates a case where the number of stages of the stepped surface 40 of the stepped structure 27 is one. Further, as another structure or material of the substrate 37, for example, a structure and a material similar to those of the substrate 25 according to the first and second embodiments can be employed.

Note that in the case where the correction lens 35 is a lens having the annular recessed portion 36 shown in FIG. 33A, FIG. 33B, FIG. 34A, FIG. 34B, FIG. 35A, and FIG. 35B, for example, an annular recessed portion, which has an annular shape along the outer periphery portion of the correction lens 35 in plan view, can be used as the stepped structure 39 of the substrate 37. That is, the plurality of stepped structures 39 having the annular stepped surface 40 having a different height from the back surface S11 may be formed on the back surface S11 of the substrate 37. In the following description, the annular recessed portion, which has an annular shape, of the stepped structure 39 is also denoted by the reference symbol "39". Further, for example, in the case where the width of the annular recessed portion 36 of the correction lens 35 is adjusted in the order shown in FIG. 33A, FIG. 33B, FIG. 34A, FIG. 34B, FIG. 35A, and FIG. 35B, the width of the annular recessed portion 39 of the substrate 37 is favorably smaller in the order of the width of the annular recessed portion 39 corresponding to the red correction lens<the width of the annular recessed portion 39 corresponding to the green correction lens<the width of the annular recessed portion 39 corresponding to the blue correction lens.

In the case where such a lens is used, the diameter of the annular recessed portion 39 of the substrate 37 is favorably smaller in the order of, for example, the diameter of the annular recessed portion 39 corresponding to the blue correction lens<the diameter of the annular recessed portion 39 corresponding to the green correction lens<the diameter of the annular recessed portion 39 corresponding to the blue correction lens. As the diameter of the annular recessed portion 39, for example, the average value of the inner diameter and the outer diameter of the annular recessed portion 39 can be employed. Further, the depth of the annular recessed portion 39 of the substrate 37 is favorably the same in all the annular recessed portions 39.

The coating layer 38 is formed on a back surface S11 side of the substrate 37 (a portion 16b side of the flattening film 16 on the color filter 18 side), and continuously covers the stepped structure 39 and the back surface S11 of the substrate 37 on a periphery of the stepped structure 39, similarly to the coating layer 26 according to the first and second embodiment. That is, the coating layer 38 is configured to cover the entire back surface S11, i.e., the entire surface having the stepped structure 39. The upper surface of the portion covering the stepped structure 39 is formed in a curved shape of the outer periphery portion of the aspherical lens.

Further, as the material of the coating layer 38, for example, a material that causes light to be transmitted therethrough and has a refractive index different from the refractive index of the material of the substrate 37 by ±10% or less of the refractive index of the material of the substrate 37 can be used. In particular, considering the reduction of the difference in the refractive index, it is favorable to use the same material as the material of the substrate 37. By reducing the difference between the refractive index of the coating layer 38 of incident light and the refractive index of the substrate 37 of incident light, scattering and reflection of incident light on the interface between the coating layer 38 and the substrate 37 can be suppressed.

3-2 Method of Producing Correction Lens

Next, a method of producing the correction lens 35 (optical element according to the third embodiment) of the solid-state imaging device 1 according to the second embodiment will be described. FIG. 37A, FIG. 37B, FIG. 38A, FIG. 38B, FIG. 39A, FIG. 39B, FIG. 40A, FIG. 40B, FIG. 41A, FIG. 41B, FIG. 42A, FIG. 42B, FIG. 43A, FIG. 43B, FIG. 44A, and FIG. 44B are plan views and cross-sectional views showing a production step of the optical element according to the second embodiment. FIG. 37A to FIG. 44B illustrate the case where the correction lens 35 is a lens having the annular recessed portion 36 shown in FIG. 33A and FIG. 33B.

Figure 37A:
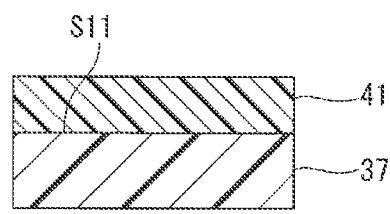
FIG. 37A is a diagram showing a flow of a step of producing an optical element in the solid-state imaging device according to the third embodiment, and is a cross-sectional view of the optical element taken along the line $A_{25}$-$A_{25}$ of FIG. 37B.
Figure 37B:
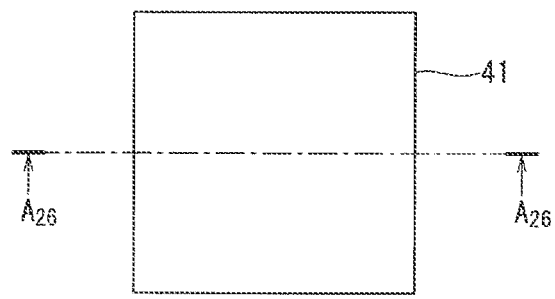
FIG. 37B is a diagram showing the flow of the step of producing the optical element in the solid-state imaging device according to the third embodiment, and is a plan view of the optical element in FIG. 37A.
Figure 38A:
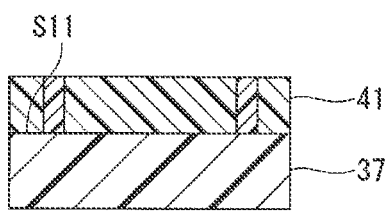
FIG. 38A is a diagram showing the flow of the step of producing the optical element in the solid-state imaging device according to the third embodiment, and is a cross-sectional view of the optical element taken along the line $A_{27}$-$A_{27}$ of FIG. 38B.
Figure 38B:
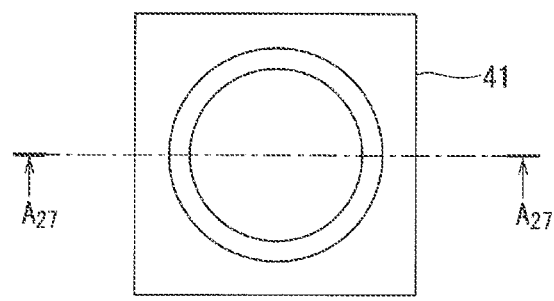
FIG. 38B is a diagram showing the flow of the step of producing the optical element in the solid-state imaging device according to the third embodiment, and is a plan view of the optical element in FIG. 38A.
Figure 39A:
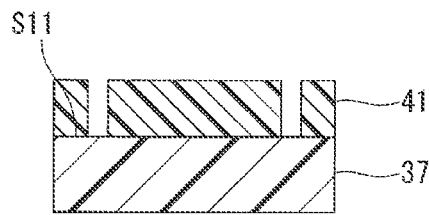
FIG. 39A is a diagram showing the flow of the step of producing the optical element in the solid-state imaging device according to the third embodiment, and is a cross-sectional view of the optical element taken along the line $A_{28}$-$A_{28}$ of FIG. 39B.
Figure 39B:
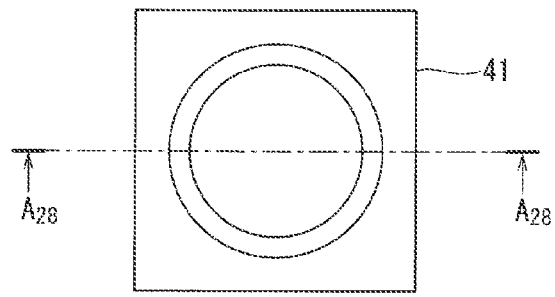
FIG. 39B is a diagram showing the flow of the step of producing the optical element in the solid-state imaging device according to the third embodiment, and is a plan view of the optical element in FIG. 39A.

First, as shown in FIG. 37A and FIG. 37B, a photoresist film 41 is applied to the entire back surface S11 of the substrate 37. Subsequently, the photoresist film 41 is exposed as shown in FIG. 38A and FIG. 38B, and the photoresist film 41 is developed as shown in FIG. 39A and FIG. 39B.

Figure 40A:
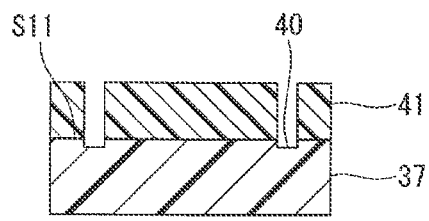
FIG. 40A is a diagram showing the flow of the step of producing the optical element in the solid-state imaging device according to the third embodiment, and is a cross-sectional view of the optical element taken along the line $A_{29}$-$A_{29}$ of FIG. 40B.
Figure 40B:
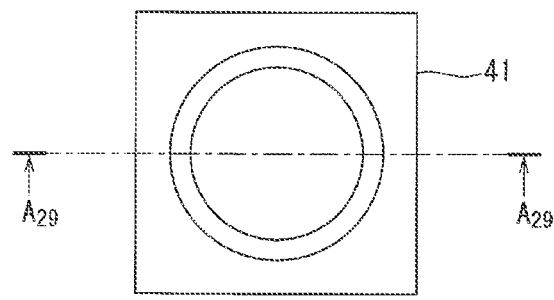
FIG. 40B is a diagram showing the flow of the step of producing the optical element in the solid-state imaging device according to the third embodiment, and is a plan view of the optical element in FIG. 40A.
Figure 41A:
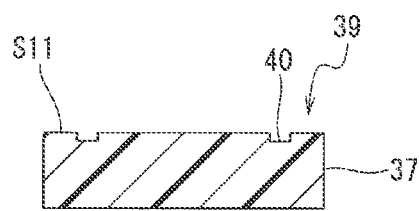
FIG. 41A is a diagram showing the flow of the step of producing the optical element in the solid-state imaging device according to the third embodiment, and is a cross-sectional view of the optical element taken along the line $A_{30}$-$A_{30}$ of FIG. 41B.
Figure 41B:
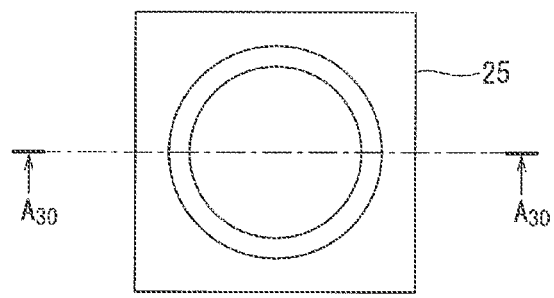
FIG. 41B is a diagram showing the flow of the step of producing the optical element in the solid-state imaging device according to the third embodiment, and is a plan view of the optical element in FIG. 41A.

Subsequently, as shown in FIG. 40A and FIG. 40B, the back surface S11 of the substrate 37 is etched by using the developed photoresist film 41 as an etching mask to form the plurality of stepped structures 39 having an annular recessed shape to be irradiated with the light that has been transmitted through the color filter 18. Subsequently, as shown in FIG. 41A and FIG. 41B, the photoresist film 41, i.e., the etching mask of the back surface S11 is removed from the back surface S11 of the substrate 37. As a result, the plurality of stepped structures 39 having an annular recessed shape regularly arranged in a two-dimensional array on the back surface S11 of the substrate 37 is formed.

Figure 42A:
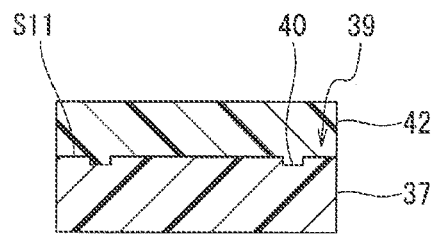
FIG. 42A is a diagram showing the flow of the step of producing the optical element in the solid-state imaging device according to the third embodiment, and is a cross-sectional view of the optical element taken along the line $A_{31}$-$A_{31}$ of FIG. 42B.
Figure 42B:
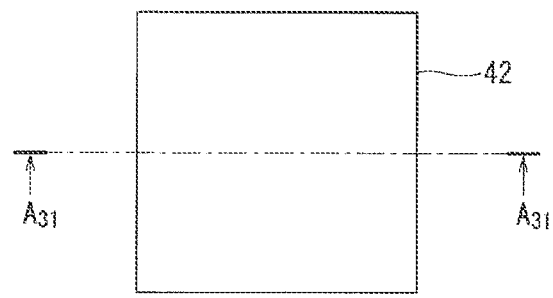
FIG. 42B is a diagram showing the flow of the step of producing the optical element in the solid-state imaging device according to the third embodiment, and is a plan view of the optical element in FIG. 42A.

Subsequently, as shown in FIG. 42A and FIG. 42B, a coating liquid 42 for forming the coating layer 38 is applied so as to cover the entire back surface S11 of the substrate 37, i.e., the entire surface having the stepped structure 39, and so that the liquid surface is horizontal. Regarding the thickness of the layer including the coating liquid 42, the part corresponding to the stepped surface 40 (bottom surface of the annular recessed portion) of the stepped structure 39 is the thickest, and the part corresponding to the portion where the stepped structure 39 is not formed is the thinnest. As the coating liquid 42, for example, a coating liquid obtained by dissolving a styrene-based resin or an acrylic-based resin in an appropriate solvent can be employed, similarly to the coating liquid 34 according to the first and second embodiments. As a method of applying the coating liquid 42, for example, a spin coat method can be employed.

Figure 43A:
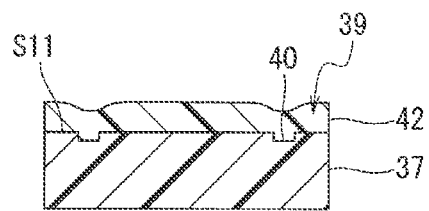
FIG. 43A is a diagram showing the flow of the step of producing the optical element in the solid-state imaging device according to the third embodiment, and is a cross-sectional view of the optical element taken along the line $A_{32}$-$A_{32}$ of FIG. 43B.
Figure 43B:
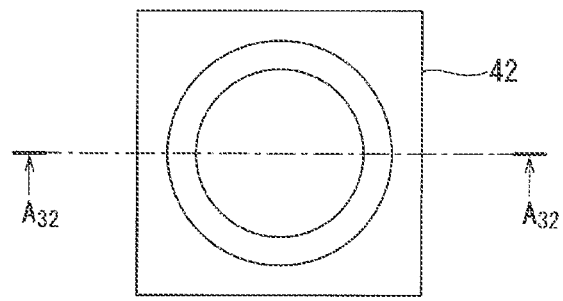
FIG. 43B is a diagram showing the flow of the step of producing the optical element in the solid-state imaging device according to the third embodiment, and is a plan view of the optical element in FIG. 43A.
Figure 44A:
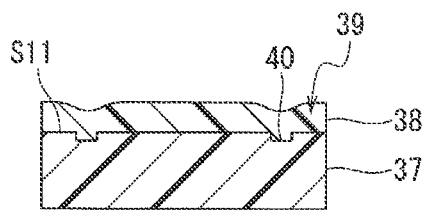
FIG. 44A is a diagram showing the flow of the step of producing the optical element in the solid-state imaging device according to the third embodiment, and is a cross-sectional view of the optical element taken along the line $A_{33}$-$A_{33}$ of FIG. 44B.
Figure 44B:
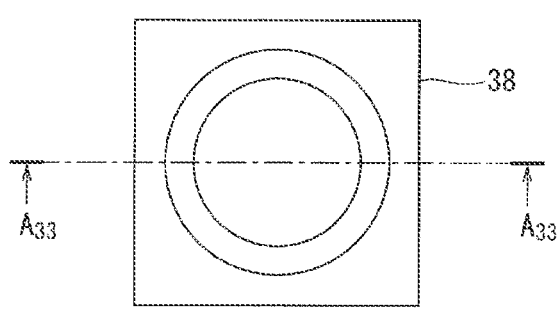
FIG. 44B is a diagram showing the flow of the step of producing the optical element in the solid-state imaging device according to the third embodiment, and is a plan view of the optical element in FIG. 44A.

Subsequently, as shown in FIG. 43A and FIG. 43B, the applied coating liquid 42 is dried. At this time, the solvent volatilizes and the thickness of the layer including the coating liquid 42 is reduced. Specifically, at an early stage of drying of the coating liquid 42, the front surface of the coating liquid 42 is flat and uniformly reduced in film thickness. However, as the drying of the coating liquid 42 proceeds, the solute concentration of the coating liquid 42 in the recessed portion becomes locally low due to the stepped structure 39 of the substrate 37. As a result, the evaporation rate of the solvent of the coating liquid 42 is increased in the recessed portion, and the front surface of the coating liquid 42 in the recessed portion is recessed. Due to this phenomenon, the amount of reduction in the thickness of the layer becomes larger where the thickness of the layer is thicker. That is, the reduction amount of the part corresponding to the stepped surface 40 (bottom surface of the annular recessed portion) of the stepped structure 39 is the largest, and the reduction amount of the part corresponding to the portion where the stepped structure 39 is not formed is the smallest. As a result, the coating layer 38 having a lens shape and an annular recessed portion is formed in a portion covering the stepped structure 39. Subsequently, as shown in FIG. 44A and FIG. 44B, the coating layer 38 having a concave lens shape is UV-cured or baked so that the formed coating layer 38 is a permanent film. As a result, the coating layer 38 is cured and the correction lens 35 shown in FIG. 33A and FIG. 33B is completed.

Note that in the case where the correction lens 35 is a lens for correcting chromatic aberrations, i.e., in the case where the correction lens 35 is a lens having the annular recessed portion 36 shown in FIG. 33A, FIG. 33B, FIG. 34A, FIG. 34B, FIG. 35A, and FIG. 35B, it is favorable to design the width and diameter of the annular recessed portion 39 of the substrate 37 in accordance with the shape of the annular recessed portion 36. That is, in the step of forming the plurality of stepped structures 39 (the annular recessed portions 39) on the substrate 37 described above, the width and diameter of the annular recessed portion 39 are adjusted in accordance with the wavelength range (color) of light transmitted through the color filter 18 corresponding to the annular recessed portion 39 as shown in FIG. 33A, FIG. 34A, and FIG. 35A. Specifically, first, the position given with a curvature and the magnitude of the curvature are designed by the annular recessed portion 36 of the correction lens 35 so as to correct the chromatic aberration caused by the wafer lens 19. Subsequently, the width and diameter (position) of the annular recessed portion 39 are optimized as parameters so that the shape of the correction lens 35 having the designed curvature can be realized by simulating the application and drying of the coating liquid 42. In this case, it is favorable that the depth of the annular recessed portion 39 of the substrate 37 is the same in all the annular recessed portions 39. As a result, all the annular recessed portions 39 of the substrate 37 can be formed simultaneously in one process flow while the shape of the correction lens 35 is made different for each wavelength region (color) of the light transmitted through the color filter 18.

As described above, in the correction lens 35 (optical element) according to the third embodiment, the substrate 37 is provided, the stepped structure 39 being formed on one surface (the back surface S11) of the substrate 37, the stepped structure 39 having the stepped surface 40 having a different height from the back surface S11. In addition, the coating layer 38 that continuously covers the stepped structure 39 and the back surface S11 on a periphery of the stepped structure 39 and causes light to be transmitted therethrough is provided. Therefore, various shapes can be realized in accordance with the shape of the stepped structure 39, and the correction lens 35 with a high flexibility of designing can be provided.

Further, in the lens group according to the third embodiment, the wafer lens 19 ("first lens" in a broad sense) and the correction lens 35 ("second lens" in a broad sense) for correcting aberrations caused by the wafer lens 19 are provided, light that has been transmitted through the wafer lens 19 entering the correction lens 35. Then, the correction lens 35 includes the substrate 37, the stepped structure 39 being formed on one surface (the back surface S11), the stepped structure 39 having the stepped surface 40 having an annular shape and a different height from the back surface S11, and the coating layer 38 that continuously covers the stepped structure 39 and the back surface S11 on a periphery of the stepped structure 39 and causes light to be transmitted therethrough. Therefore, a lens with optical performance equivalent to that of a complex aspherical lens can be realized relatively easily.

Further, in the lens group according to the third embodiment, the correction lens 35 (second lens) is a lens for correcting chromatic aberrations caused by the wafer lens 19 (first lens). Therefore, it is possible to prevent the sensitivity of the photoelectric conversion unit 23 corresponding to the wafer lens 19 from being reduced, and prevent the color mixing in the photoelectric conversion unit 23 on a periphery of the photoelectric conversion unit 23 from occurring.

Further, the method of producing the optical element according to the third embodiment includes: a step of forming the plurality of stepped structures 39 regularly arrayed in a two-dimensional array on the substrate 37; a step of applying the coating liquid 42 to the substrate 37 on which the plurality of stepped structures 39 has been formed; and a step of drying the coating liquid 42 so that the coating layer 38 that continuously covers the plurality of stepped structures 39 and the surface of the substrate 37 on a periphery of the plurality of stepped structures 39 and causes light to be transmitted therethrough is formed. Then, each of the stepped structures 39 includes the annular recessed portion 39 for forming a lens that the light that has been transmitted through the color filter 18 enters. Further, in the step of forming the plurality of stepped structures 39 on the substrate 37, the width and diameter of each of the plurality of annular recessed portions 39 are adjusted in accordance with the wavelength range (color) of light transmitted through the color filter 18 corresponding to the annular recessed portion 39. Therefore, the depth of the annular recessed portion 39 of the substrate 37 can be the same and all the annular recessed portions 39 can be formed simultaneously in one process flow.

Incidentally, for example, as described in Patent Literature 1, in the thermal reflow method of forming a lens by forming a lens forming pattern layer on each of the upper surfaces of the respective stepped structures and then thermally reflowing the lens forming pattern layer, since the curved surface structure is formed by utilizing the front surface tension, it is difficult to make a lens have a gentle curvature portion, and an aberration correction lens cannot be formed.

In contrast, in the method of producing the optical element according to the third embodiment, the front surface of the coating layer 38 can have a gradual curvature portion and the front surface of the coating layer 38 can be varied with high controllability in accordance with the shape of the stepped structure 39. Further, the stepped structure 39 can be designed so that a desired shape of the correction lens 35 can be realized by simulating the application and drying of the coating liquid 42.

Figure 45:
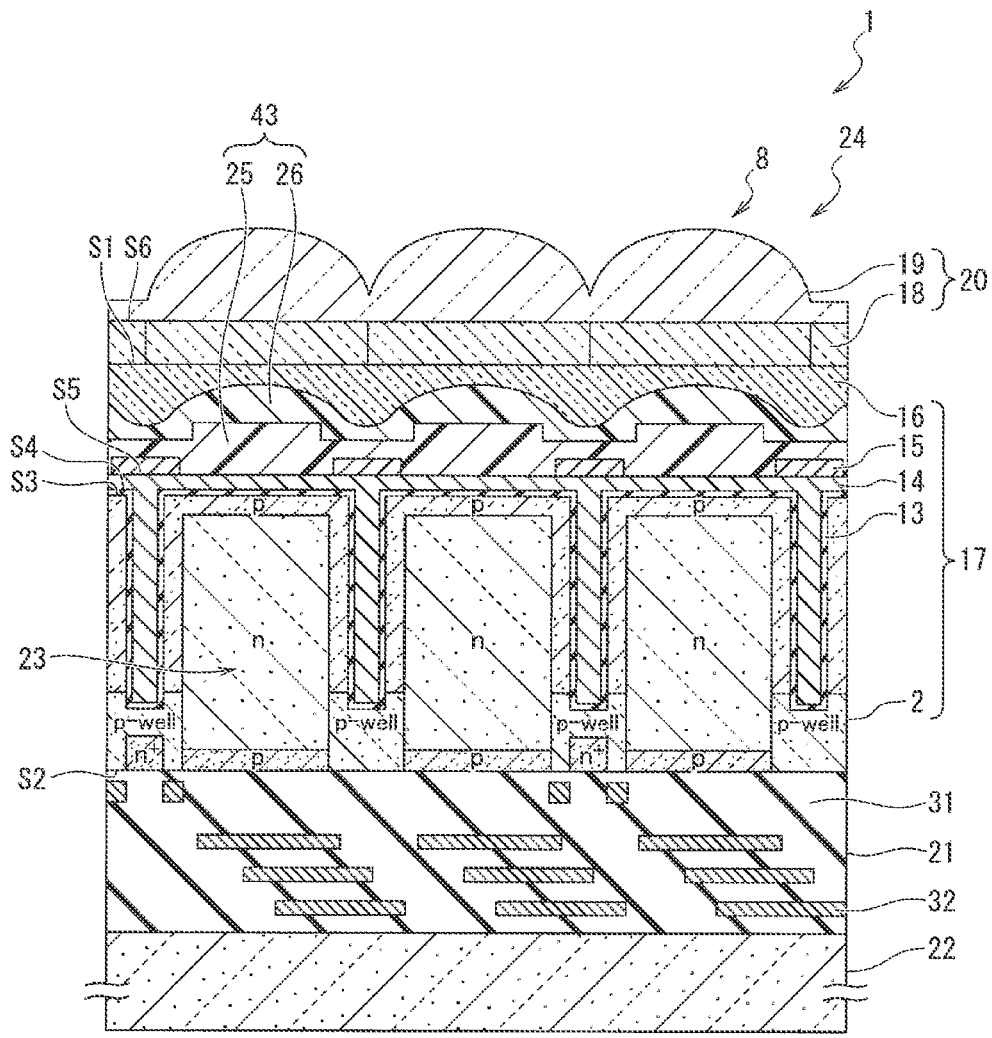
FIG. 45 is a diagram showing a cross-sectional configuration of a pixel region of the solid-state imaging device according to the modified example.
Figure 46:
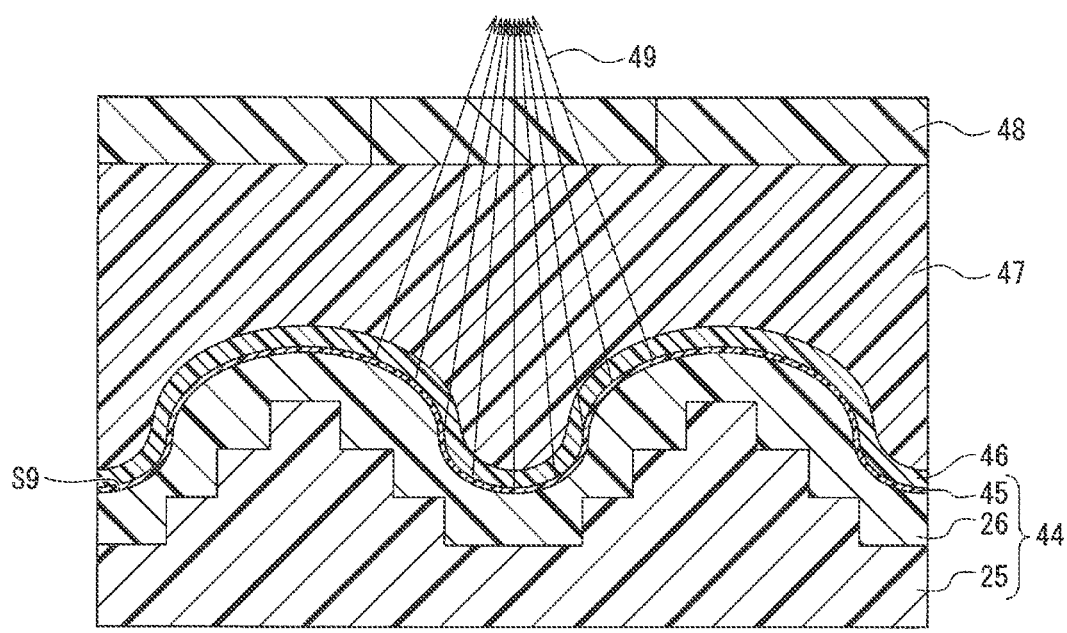
FIG. 46 is a diagram showing a cross-sectional configuration of a reflector of an optical element according to the modified example.

3-3 Modified Example (1) In the solid-state imaging device 1 according to the first and second embodiments, the case where the optical element according to the present disclosure is used for the wafer lens 19 has been described as an example, but the optical element according to the present disclosure is applicable also to an inner lens 43 formed on the flattening film 16 as shown in FIG. 45, for example. Further, for example, as shown in FIG. 46, the optical element according to the present disclosure is applicable also to a reflector 44 used for a display device or the like. FIG. 46 illustrates a case where a reflector lens 45 (reflective layer) that reflects light, a light-emitting layer 46 that emits light, an interlayer film 47 that forms a flat surface having no irregularities, and a color filter 48 formed corresponding to the wavelength of light to be displayed are staked on a front surface S9 of the coating layer 26 having a concave lens shape in the stated order. In FIG. 46, a reflected light 49 reflected by the reflector 44 is indicated by an arrow.

(2) Further, the present disclosure is not limited to the solid-state imaging device where the distribution of the incident light amount of visible light is detected and imaged as an image as in the solid-state imaging device 1 according to the first and second embodiments. For example, the present disclosure is applicable to a solid-state imaging device where distribution of the incident light amount of infrared rays, X-rays, particles, or the like is imaged as an image. Further, the present disclosure is applicable also to a general solid-state imaging device (physical quantity distribution detecting device), such as a fingerprint detecting sensor that detects distribution of another physical quantity such as pressure and electrostatic capacity and images it as an image.

(3) The present disclosure is not limited to the solid-state imaging device where each of the pixels 9 of the pixel region 3 is sequentially scanned on a row-by-row basis to read a pixel signal from each of the pixels 9 as in the solid-state imaging device 1 according to the first and second embodiments. For example, the present disclosure is applicable also to an X-Y address-type solid-state imaging device where an arbitrary pixel 9 is selected in units of pixels to read a signal from the selected pixel 9 in units of pixels.

(4) Further, in the solid-state imaging device 1 according to the third embodiment, the case where the correction lens 35 is disposed in the flattening film 16 has been described as an example, but the correction lens 35 may be disposed on the light receiving surface side of the wafer lens 19 so that light before being transmitted through the wafer lens 19 enters the correction lens 35, for example.

Figure 47A:
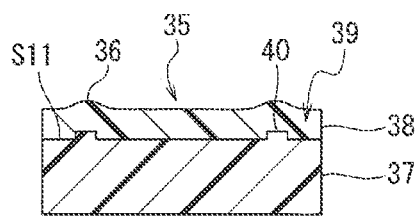
FIG. 47A is a cross-sectional view of a correction lens of the solid-state imaging device according to the modified example taken along the line $A_{34}$-$A_{34}$ of FIG. 47B.
Figure 47B:
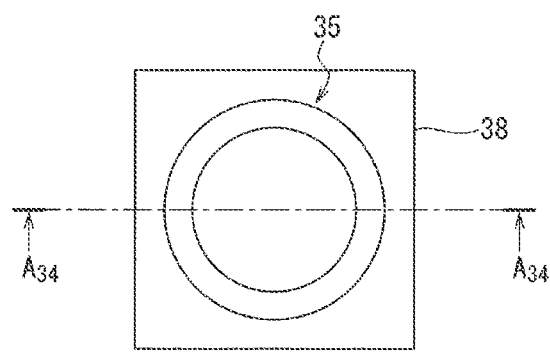
FIG. 47B is a plan view of the correction lens in FIG. 47A.

(5) In the solid-state imaging device 1 according to the third embodiment, the case where an annular recessed portion having an annular shape is formed as the stepped structure 39 of the substrate 37 constituting the correction lens 35 has been described as an example, but an annular projecting portion having an annular shape may be formed as shown in FIG. 47A and FIG. 47B, for example.

Figure 48A:
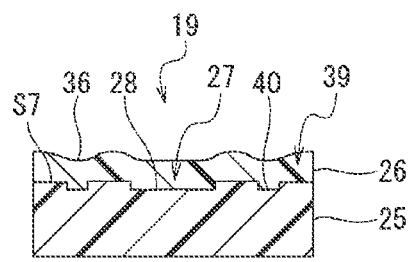
FIG. 48A is a cross-sectional view of a wafer lens of the solid-state imaging device according to the modified example taken along the line $A_{35}$-$A_{35}$ in FIG. 48B.
Figure 48B:
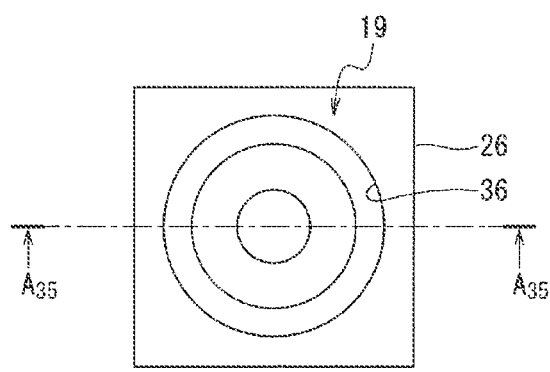
FIG. 48B is a plan view of a lens disposed in a pixel corresponding to a color filter that causes light having a red wavelength to be transmitted therethrough in FIG. 48A.
Figure 49A:
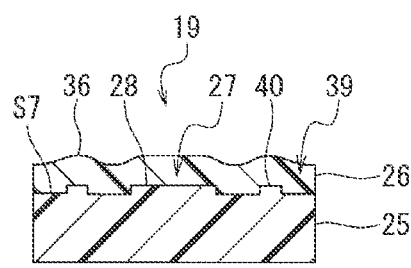
FIG. 49A is a cross-sectional view of the wafer lens of the solid-state imaging device according to the modified example taken along the line $A_{35}$-$A_{35}$ of FIG. 48B.
Figure 49B:
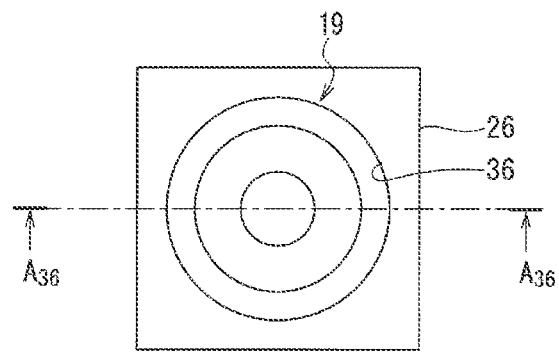
FIG. 49B is a plan view of the lens disposed in the pixel corresponding to the color filter that causes light having a red wavelength to be transmitted therethrough in FIG. 48A.

(6) Further, in the solid-state imaging device 1 according to the third embodiment, the case where the aspherical lens is realized by combining the wafer lens 19 and the correction lens 35 to form a lens group has been described as an example, but the methods of producing the optical element according to the first, second, and third embodiments may be combined to form the wafer lens 19 having an aspherical lens shape as shown in FIG. 48A, FIG. 48B, FIG. 49A, and FIG. 49B, for example. FIG. 48A and FIG. 48B illustrate the case where the stepped structure 27 ("first stepped structure" in a broad sense), which is a recessed portion, and the stepped structure 39 ("second stepped structure" in a broad sense), which is an annular recessed portion and has the annular stepped surface 40 surrounding the periphery of the stepped structure 27, are formed on the back surface S7 of the substrate 25 constituting the wafer lens 19. Further, FIG. 49A and FIG. 49B illustrate a case where the stepped structure 27 (first stepped structure), which is a projecting portion, and the stepped structure 39 (second stepped surface), which is an annular projecting portion and has the annular stepped surface 40 surrounding the periphery of the stepped structure 27, are formed on the back surface S7 of the substrate 25 constituting the wafer lens 19. In this case, the coating layer 26 continuously covers the stepped structure 27, the stepped structure 39, and the back surface S7 on a periphery of the stepped structure 27 and the stepped structure 39 and causes light to be transmitted therethrough.

Figure 50A:
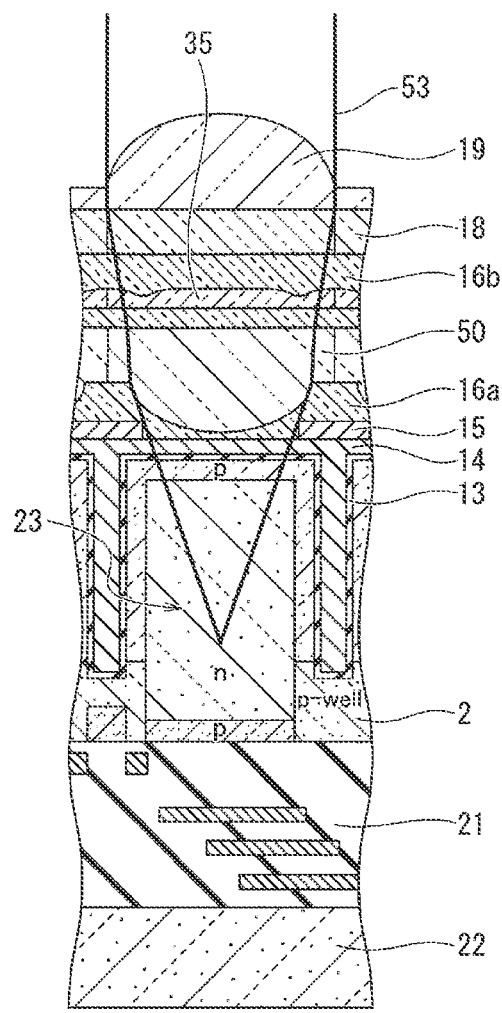
FIG. 50A is a diagram showing a collection state of light by a lens group configured in a pixel corresponding to the color filter that causes light having a red wavelength to be transmitted therethrough.
Figure 50B:
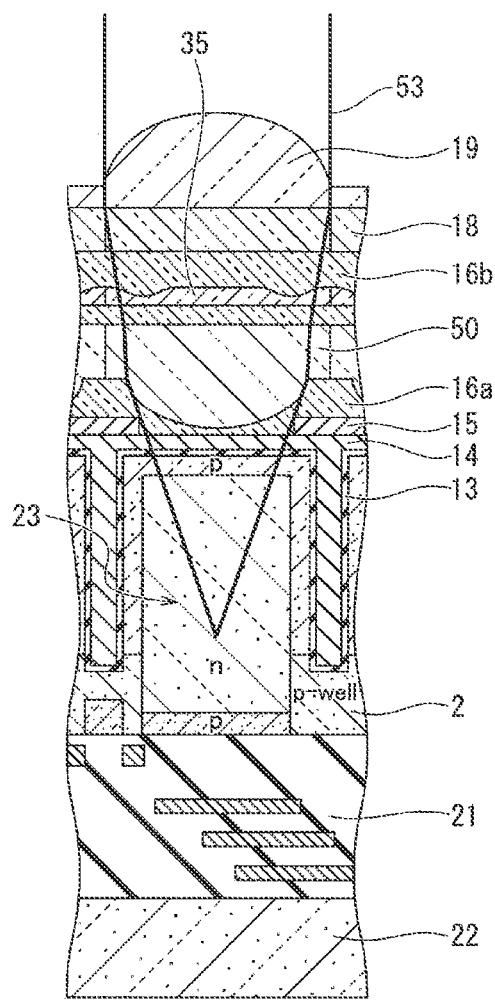
FIG. 50B is a diagram showing a collection state of light by a lens group configured in a pixel corresponding to a color filter that causes light having a green wavelength to be transmitted therethrough.
Figure 50C:
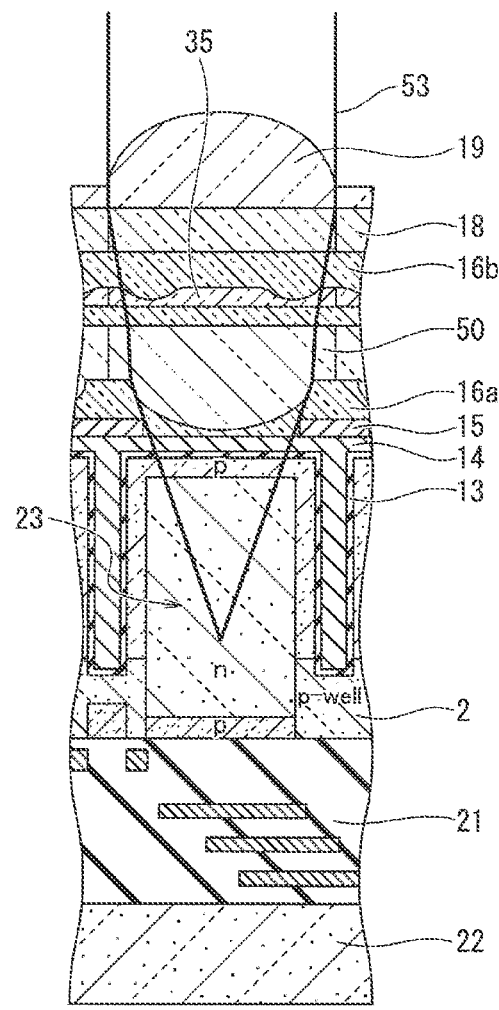
FIG. 50C is a diagram showing a collection state of light by a lens group configured in a pixel corresponding to a color filter that causes light having a blue wavelength to be transmitted therethrough.

(7) Further, in the solid-state imaging device 1 according to the third embodiment, an example where a lens group is configured by combining the wafer lens 19 and the correction lens 35 has been shown, but an inner lens may also be combined in addition to the wafer lens 19 and the correction lens 35 to form a lens group, for example. Specifically, as shown in FIG. 50A, FIG. 50B, and FIG. 50C, an inner lens 50 may be provided between the correction lens 35 and the photoelectric conversion unit 23 and a lens group obtained by combining the wafer lens 19, the correction lens 35, and the inner lens 50 may be configured. FIG. 50A illustrates the collection state of the light 53 by a lens group configured in the pixel 9 corresponding to the color filter 18 that causes light of red wavelengths to be transmitted therethrough. Further, FIG. 50B illustrates the collection state of the light 53 by a lens group configured in the pixel 9 corresponding to the color filter 18 that causes light of green wavelengths to be transmitted therethrough. Further, FIG. 50C illustrates the collection state of the light 53 by a lens group configured in the pixel 9 corresponding to the color filter 18 that causes light of blue wavelengths to be transmitted therethrough.

Figure 51A:
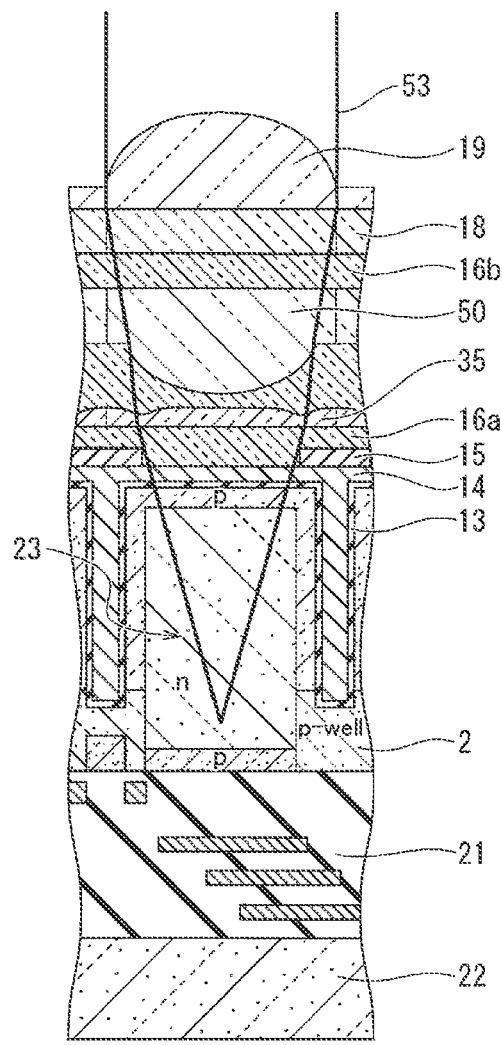
FIG. 51A is a diagram showing a collection state of light by a lens group configured in a pixel corresponding to the color filter that causes light having a red wavelength to be transmitted therethrough.
Figure 51B:
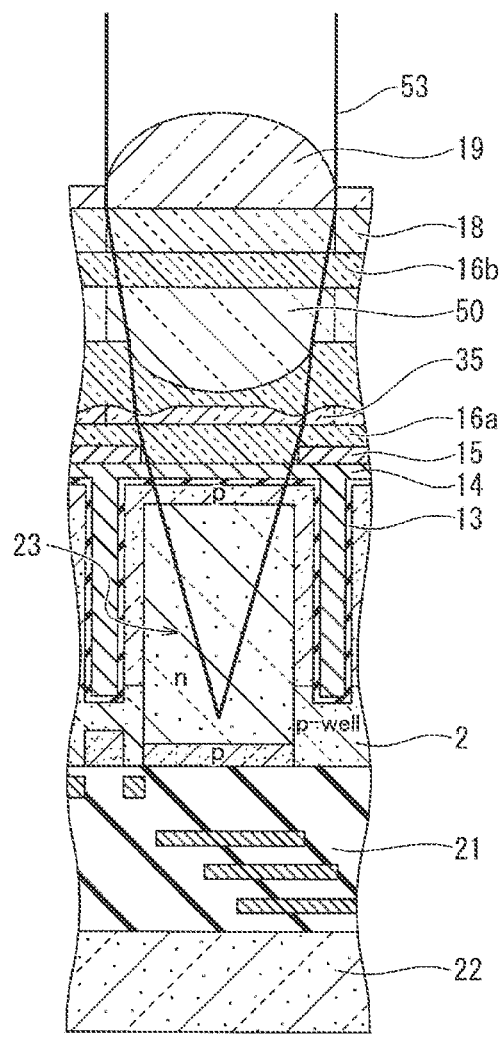
FIG. 51B is a diagram showing a collection state of light by a lens group configured in a pixel corresponding to the color filter that causes light having a green wavelength to be transmitted therethrough.
Figure 51C:
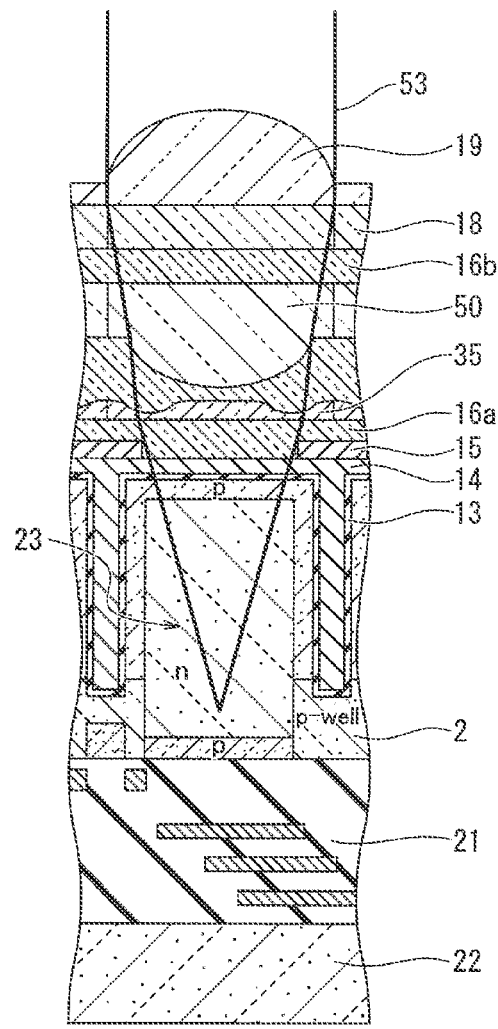
FIG. 51C is a diagram showing a collection state of light by a lens group configured in a pixel corresponding to the color filter that causes light having a blue wavelength to be transmitted therethrough.

Further, for example, as shown in FIG. 51A, FIG. 51B, and FIG. 51C, an inner lens 51 may be provided between the wafer lens 19 and the correction lens 35 and a lens group obtained by combining the wafer lens 19, the inner lens 51, and the correction lens 35 may be configured. FIG. 51A illustrates the collection state of the light 53 by a lens group configured in the pixel 9 corresponding to the color filter 18 that causes light of red wavelengths to be transmitted therethrough. Further, FIG. 51B illustrates the collection state of the light 53 by a lens group configured in the pixel 9 corresponding to the color filter 18 that causes light of green wavelengths to be transmitted therethrough. Further, FIG. 51C illustrates the collection state of the light 53 by a lens group configured in the pixel 9 corresponding to the color filter 18 that causes light of blue wavelengths to be transmitted therethrough. In the case where such a lens group is formed, the correction lens 35 is designed so that substantially all of the light that has entered the wafer lens 19 enters the photoelectric conversion unit 23 corresponding to the lens group by being transmitted via the lens group.

(8) Further, in the solid-state imaging device 1 according to the third embodiment, the case where the correction lens 35 for correcting chromatic aberrations caused by the wafer lens 19 is formed corresponding to each of all the wafer lenses 19 has been shown as shown in FIG. 31, FIG. 32A, FIG. 32B, and FIG. 32C, but the correction lens 35 may be formed corresponding to only a part of the wafer lenses 19, for example. For example, in the case where the imaging position of light by the wafer lens 19 corresponding to the color filter 18 that causes light of blue wavelengths to be transmitted therethrough deviates most from the central portion of the photoelectric conversion unit 23 corresponding to the wafer lens 19, the correction lens 35 may be formed corresponding only to the wafer lens 19.

(9) Further, in the solid-state imaging device 1 according to the third embodiment, the case where the correction lens 35 is configured to increase the light collection rate of the aspherical lens realized by combining the wafer lens 19 and the correction lens 35 has been described as an example, but the correction lens 35 may be configured to decrease the light collection rate of the aspherical lens, for example. For example, in the case where a filter that shields infrared light is provided corresponding to each of the plurality of pixels 9, there is a possibility that the pixel 9 in which the amount of received infrared light is larger than that of other photoelectric conversion units 23 is generated due to variations in the light shielding performance of the filter. In contrast, by configuring the correction lens 35 so that the light collection rate of the infrared light in the aspherical lens is lowered, even if the pixel 9 in which the amount of received infrared light is large is generated, it is possible to reduce the amount of infrared light entering the photoelectric conversion unit 23 corresponding to the pixel 9.

4. Fourth Embodiment: Electronic Apparatus

Next, an electronic apparatus according to a fourth embodiment of the present disclosure will be described. FIG. 52 is a schematic configuration diagram of an electronic apparatus 100 according to a fourth embodiment of the present disclosure.

The electronic apparatus 100 according to fourth embodiment includes a solid-state imaging device 101, an optical lens 102, a shutter device 103, a drive circuit 104, and a signal processing circuit 105. The electronic apparatus 100 according to the fourth embodiment shows an embodiment in the case where the solid-state imaging device 1 according to the first embodiment of the present disclosure is used for an electronic apparatus (e.g., camera) as the solid-state imaging device 101.

The optical lens 102 images the image light (the incident light 106) from a subject onto the imaging surface of the solid-state imaging device 101. As a result, signal charges are accumulated in the solid-state imaging device 101 for a certain time. The shutter device 103 controls a period in which the solid-state imaging device 101 is irradiated with light and a period in which light is shielded. The drive circuit 104 supplies drive signals for controlling the transfer operation of the solid-state imaging device 101 and the shutter operation of the shutter device 103. In accordance with the drive signal (timing signal) supplied from the drive circuit 104, signal transfer of the solid-state imaging device 101 is performed. The signal processing circuit 105 performs various types of signal processing on a signal (pixel signal) output from the solid-state imaging device 101. The video signal on which signal processing has been performed is stored in a storage medium such as a memory, or is output to a monitor.

Note that the electronic apparatus 100 to which the solid-state imaging device 1 can be applied is not limited to a camera, and the solid-state imaging device 1 can be applied to other electronic apparatuses. For example, the solid-state imaging device 1 may be applied to an imaging device such as a camera module for mobile devices such as mobile phones and tablet terminals.

Further, in the fourth embodiment, the solid-state imaging device 1 according to the first embodiment is used for an electronic apparatus as the solid-state imaging device 101, but other configurations may be used. For example, the solid-state imaging device 1 according to the second embodiment, the solid-state imaging device 1 according to the third embodiment, or the solid-state imaging device 1 according to the modified example may be used for an electronic apparatus.

5. Application Example to Moving Objects

The technology according to the present disclosure (the present technology) is applicable to various products. For example, the technology according to the present disclosure may be realized as an apparatus mounted on any type of moving objects such as an automobile, an electric car, a hybrid electric vehicle, a motorcycle, a bicycle, personal mobility, an airplane, a drone, a ship, and a robot.

Figure 53:
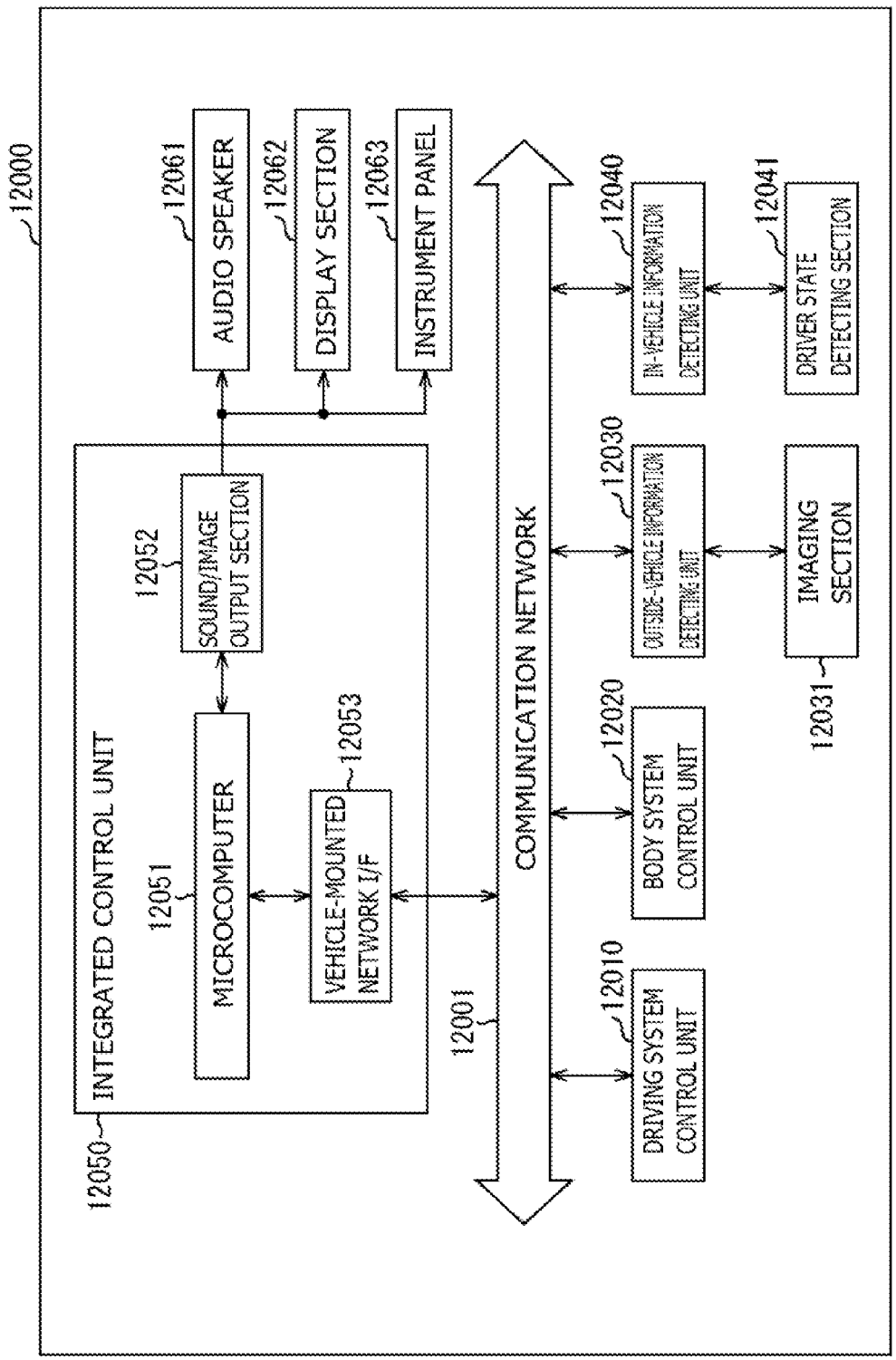
FIG. 53 is a block diagram depicting an example of schematic configuration of a vehicle control system.

FIG. 53 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 53, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 53, an audio speaker 12061, a display section 12062, and an instrument panel 12063 are illustrated as the output device. The display section 12062 may, for example, include at least one of an on-board display and a head-up display.

Figure 54:
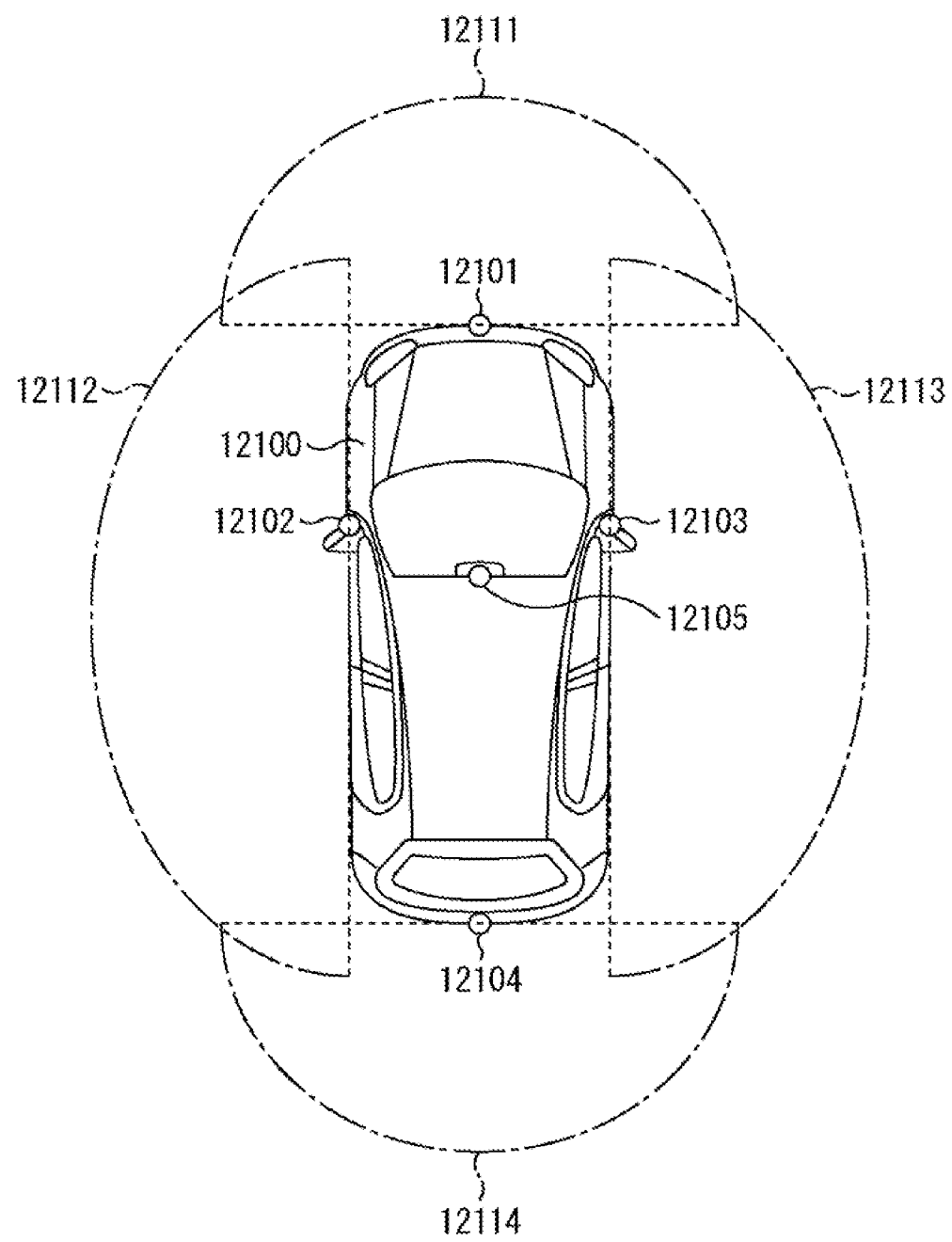
FIG. 54 is a diagram of assistance in explaining an example of installation positions of an outside-vehicle information detecting section and an imaging section.

FIG. 54 is a diagram depicting an example of the installation position of the imaging section 12031.

In FIG. 54, the vehicle 12100 includes as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging sections 12101 and 12105 are used mainly to detect a preceding vehicle, a pedestrian, an obstacle, a signal, a traffic sign, a lane, or the like.

Incidentally, FIG. 54 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described above. The technology according to the present disclosure can be applied to the imaging section 12031 or the like among the configurations described above. Specifically, the solid-state imaging device 1 in FIG. 1 can be applied to the imaging section 12031. By applying the technology according to the present disclosure to the imaging section 12031, it is possible to obtain a captured image that is easier to see, so that fatigues of the drivers can be reduced.

6. Application Example to Endoscopic Surgery System

The technology according to the present disclosure (present technology) is applicable to various products. For example, the technology according to the present disclosure may be applied to an endoscopic surgery system.

Figure 55:
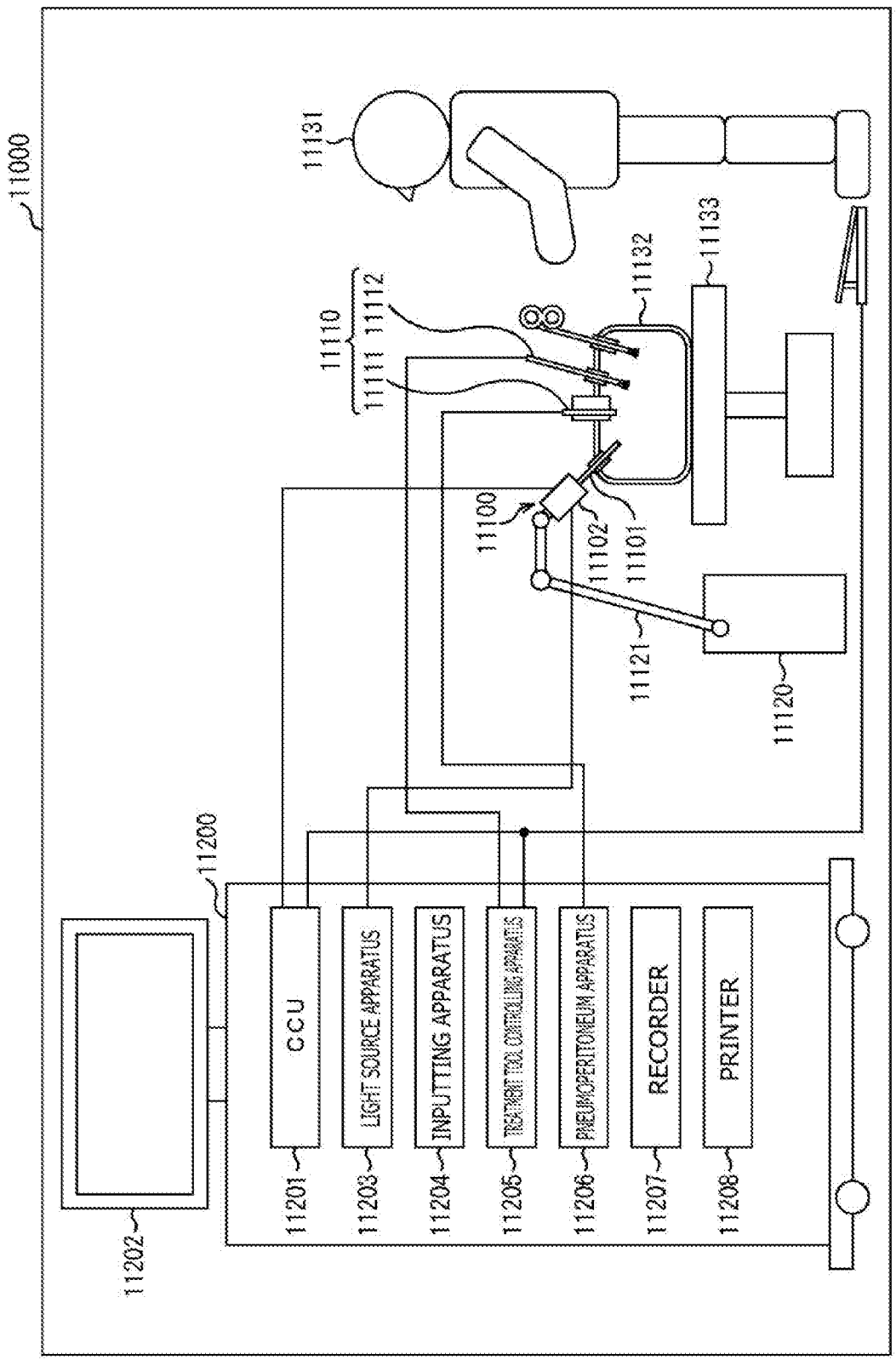
FIG. 55 is a view depicting an example of a schematic configuration of an endoscopic surgery system.

FIG. 55 is a view depicting an example of a schematic configuration of an endoscopic surgery system to which the technology according to an embodiment of the present disclosure (present technology) can be applied.

In FIG. 55, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 56:
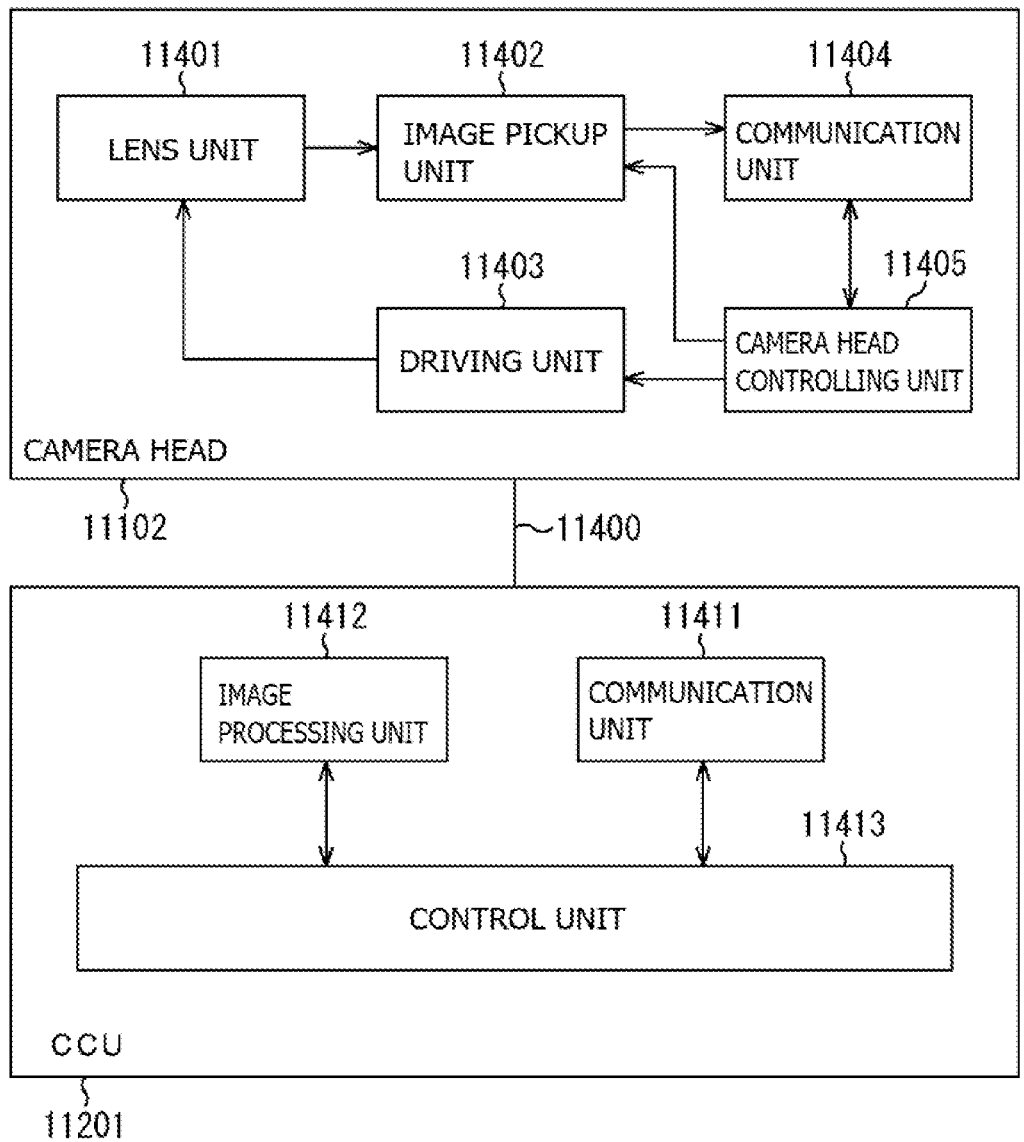
FIG. 56 is a block diagram depicting an example of a functional configuration of a camera head and a camera control unit (CCU).

FIG. 56 is a block diagram depicting an example of a functional configuration of the camera head 11102 and the CCU 11201 depicted in FIG. 55.

The camera head 11102 includes a lens unit 11401, an image pickup unit 11402, a driving unit 11403, a communication unit 11404 and a camera head controlling unit

11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described above. The technology according to the present disclosure can be applied to, for example, the endoscope 11100, the image pickup unit 11402 of the camera head 11102, or the like among the configurations described above. Specifically, the solid-state imaging device 1 in FIG. 1 can be applied to the image pickup unit 10402. By applying the technology according to the present disclosure to the image pickup unit 11402, it is possible to obtain a clearer surgical site image, so that the operator can reliably check the surgical site.

Note that the endoscopic surgery system has been described here as an example, but the technology according to the present disclosure may be applied to, for example, a microscopic surgery system or the like.

It should be noted that the present technology may also take the following configurations.

(1) An optical element, including:
   a substrate, a stepped structure being formed on one surface of the substrate, the stepped structure having a stepped surface having a different height from the one surface; and
   a coating layer that continuously covers the stepped structure and the one surface on a periphery of the stepped structure and causes light to be transmitted therethrough or reflects the light.

(2) The optical element according to (1) above, in which
   the stepped structure has, as a side surface for connecting the one surface and the stepped surface, an inclined surface or a curved surface inclined with respect to a normal direction of the one surface.

(3) The optical element according to (1) above, in which
   the stepped structure has the stepped surface, the stepped surface including stepped surfaces of two or more stages.

(4) The optical element according to (3) above, in which
   the stepped structure has, as a side surface for connecting the one surface and the stepped surface and as a side surface for connecting the stepped surfaces, the stepped surfaces being two stepped surfaces of two stages, at least one of a perpendicular surface parallel to a normal direction of the one surface and an inclined surface and a curved surface inclined with respect to the normal direction of the one surface.

(5) The optical element according to (2) or (4) above, in which
   an inclination angle of the inclined surface is 0 degrees or more and 60 degrees or less with respect to the normal direction of the one surface.

(6) The optical element according to any one of (1) to (5) above, in which
   a ratio of a width and a height of the stepped structure is in a range of 1:10 to 10:1

(7) The optical element according to any one of (1) to (6) above, in which
   the stepped structure has at least one of a circular shape, a polygonal shape, or an elliptical shape in plan view.

(8) The optical element according to (7) above, in which
   an aspect ratio of the elliptical shape is 1 or more and 5 or less.

(9) The optical element according to (3) above, in which
   outer peripheries of the stepped surfaces of the stepped structure are separated from each other in plan view.

(10) The optical element according to any one of (1) to (9) above, in which
   a difference between a refractive index of a material of the substrate and a refractive index of a material of the coating layer is ±10% or less of the refractive index of the material of the substrate.

(11) The optical element according to any one of (1) to (10) above, in which
   the stepped structure forms a projecting portion, and
   the coating layer continuously covers an upper surface and a side wall surface of the projecting portion and the one surface on a periphery of the projecting portion, and causes light to be transmitted therethrough or reflects the light.

(12) The optical element according to any one of (1) to (10) above, in which
   the stepped structure forms a recessed portion, and
   the coating layer continuously covers a bottom surface and an inner side wall surface of the recessed portion and the one surface on a periphery of the recessed portion and causes light to be transmitted therethrough or reflects the light.

(13) The optical element according to any one of (1) to (5) and (10) above, in which
   the stepped structure includes a first stepped structure and a second stepped structure having an annular stepped surface surrounding a periphery of the first stepped structure, and
   the coating layer continuously covers the first stepped structure, the second stepped structure, and the one surface on a periphery of the first stepped structure and the second stepped structure and causes light to be transmitted therethrough.

(14) An optical element array, including:
   a substrate having a plurality of stepped structures regularly arranged in a two-dimensional array; and
   a coating layer that continuously covers the plurality of stepped structures and a surface of the substrate on a periphery of the plurality of stepped structures, each of portions of the coating layer covering the plurality of stepped structures causing light to be transmitted therethrough or reflects the light.

(15) An optical element array, including:
   a plurality of first lenses regularly arranged in a two-dimensional array; and
   a plurality of second lenses that includes a substrate, a plurality of stepped structures being formed on one surface of the substrate, each of the plurality of stepped structures having an annular stepped surface having a different height from the one surface, and a coating layer that continuously covers the stepped structure and the one surface on a periphery of the stepped structure and causes light to be transmitted therethrough, and corrects aberrations caused by the plurality of first lenses, light before or after being transmitted through the plurality of first lenses entering the plurality of second lenses.

(16) The optical element array according to (15) above, in which
   each of the plurality of second lenses is a lens for correcting chromatic aberrations caused by the plurality of first lenses.

(17) A lens group, including:
   a first lens; and
   a second lens that corrects an aberration caused by the first lens, light before or after being transmitted through the first lens entering the second lens, in which
   the second lens includes
      a substrate, a stepped structure being formed on one surface of the substrate, the stepped structure having an annular stepped surface having a different height from the one surface, and
      a coating layer that continuously covers the stepped structure and the one surface on a periphery of the stepped structure and causes light to be transmitted therethrough.

(18) The lens group according to (17) above, in which the second lens is a lens for correcting a chromatic aberration caused by the first lens.

(19) An electronic apparatus, including:
a solid-state imaging device that includes a microlens array including a substrate having a plurality of stepped structures of a plurality of stages regularly arranged in a two-dimensional array, and a coating layer that continuously covers the plurality of stepped structures of the plurality of stages and a surface of the substrate on a periphery of the plurality of stepped structures, each of portions of the coating layer covering the plurality of stepped structures having a lens shape;
an optical lens that forms an image of image light from a subject onto an imaging surface of the solid-state imaging device; and
a signal processing circuit that performs signal processing on a signal output from the solid-state imaging device.

(20) A method of producing an optical element, including:
a step of forming a stepped structure on a substrate;
a step of applying a coating liquid to the substrate on which the stepped structure has been formed; and
a step of drying the coating liquid so that a coating layer that continuously covers the stepped structure and a surface of the substrate on a periphery of the stepped structure and causes light to be transmitted therethrough or reflects the light is formed.

(21) A method of producing an optical element, including:
a step of forming a plurality of stepped structures regularly arranged in a two-dimensional array on a substrate;
a step of applying a coating liquid to the substrate on which the plurality of stepped structures has been formed; and
a step of drying the coating liquid so that a coating layer that continuously covers the plurality of stepped structures and a surface of the substrate on a periphery of the plurality of stepped structures and causes light to be transmitted therethrough is formed, in which
each of the plurality of stepped structures includes an annular recessed portion for forming a lens, light before or after being transmitted through a color filter entering the lens, and
in the step of forming the plurality of stepped structures on the substrate, a width and a diameter of each of the plurality of annular recessed portions are adjusted in accordance with a wavelength range of light transmitted through the color filter corresponding to the annular recessed portion.

REFERENCE SIGNS LIST 1 solid-state imaging device, 2 substrate, 3 pixel region, 4 vertical drive circuit, 5 column signal processing circuit, 6 horizontal drive circuit, 7 output circuit, 8 control circuit, 9 pixel, 10 pixel drive wiring, 11 vertical signal line, 12 horizontal signal line, 13 fixed charge film, 14 insulating film, 15 light-shielding film, 16 flattening film, 17 light receiving layer, 18 color filter, 19 wafer lens, 20 light collection layer, 21 wiring layer, 22 support substrate, 23 photoelectric conversion unit, 24 microlens array, 25 substrate, 26 coating layer, 27 stepped structure, 28, 28a, 28b, 28c, 28d, 28e, 28f stepped surface, 29 side surface, 30 side surface, 31 interlayer insulating film, 32 wiring, 33 photoresist film, 34 coating liquid, 35 correction lens, 36 annular recessed portion, 37 substrate, 38 coating layer, 39 annular recessed portion (stepped structure), 40 stepped surface, 41 photoresist film, 42 coating liquid, 43 inner lens, 44 reflector, 45 reflector lens, 46 light-emitting layer, 47 interlayer film, 48 color filter, 49 reflected light, 50, 51 an inner lens, 100 electronic apparatus, 101 solid-state imaging device, 102 optical lens, 103 shutter device, 104 drive circuit, 105 signal processing circuit, 106 incident light

What is claimed is:

1. An optical element, comprising:
a substrate, a stepped structure being formed on one surface of the substrate, the stepped structure having a stepped surface having a different height from the one surface; and
a coating layer that continuously covers the stepped structure and the one surface on a periphery of the stepped structure and causes light to be transmitted therethrough or reflects the light,
wherein the stepped structure includes a first stepped structure and a second stepped structure having an annular stepped surface surrounding a periphery of the first stepped structure, and
wherein the coating layer continuously covers the first stepped structure, the second stepped structure, and the one surface on a periphery of the first stepped structure and the second stepped structure and causes light to be transmitted therethrough.

2. The optical element according to claim 1, wherein the stepped structure has, as a side surface for connecting the one surface and the stepped surface, an inclined surface or a curved surface inclined with respect to a normal direction of the one surface.

3. The optical element according to claim 1, wherein the stepped structure has the stepped surface, the stepped surface including stepped surfaces of two or more stages.

4. The optical element according to claim 3, wherein the stepped structure has, as a side surface for connecting the one surface and the stepped surface and as a side surface for connecting the stepped surfaces, the stepped surfaces being two stepped surfaces of two stages, at least one of a perpendicular surface parallel to a normal direction of the one surface and an inclined surface and a curved surface inclined with respect to the normal direction of the one surface.

5. The optical element according to claim 4, wherein an inclination angle of the inclined surface is 0 degrees or more and 60 degrees or less with respect to the normal direction of the one surface.

6. The optical element according to claim 1, wherein a ratio of a width and a height of the stepped structure is in a range of 1:10 to 10:1.

7. The optical element according to claim 1, wherein the stepped structure has at least one of a circular shape, a polygonal shape, or an elliptical shape in plan view.

8. The optical element according to claim 7, wherein an aspect ratio of the elliptical shape is 1 or more and 5 or less.

9. The optical element according to claim 3, wherein outer peripheries of the stepped surfaces of the stepped structure are separated from each other in plan view.

10. The optical element according to claim 1, wherein a difference between a refractive index of a material of the substrate and a refractive index of a material of the coating layer is +10% or less of the refractive index of the material of the substrate.

11. The optical element according to claim 1, wherein
the stepped structure forms a projecting portion, and
the coating layer continuously covers an upper surface and a side wall surface of the projecting portion and the one surface on a periphery of the projecting portion, and causes light to be transmitted therethrough or reflects the light.

12. The optical element according to claim 1, wherein
the stepped structure forms a recessed portion, and
the coating layer continuously covers a bottom surface and an inner side wall surface of the recessed portion and the one surface on a periphery of the recessed portion and causes light to be transmitted therethrough or reflects the light.

13. An optical element array, comprising:
a substrate having a plurality of stepped structures regularly arranged in a two-dimensional array on one surface of the substrate, each of the stepped structures having a stepped surface having a different height from the one surface; and
a coating layer that continuously covers the plurality of stepped structures and the one surface of the substrate on a periphery of the plurality of stepped structures, each of portions of the coating layer covering the plurality of stepped structures causing light to be transmitted therethrough or reflects the light,
wherein each of the stepped structure includes a first stepped structure and a second stepped structure having an annular stepped surface surrounding a periphery of the first stepped structure, and
wherein the coating layer continuously covers the first stepped structure and the second stepped structure of each of the stepped structures, and the one surface on a periphery of the plurality of stepped structures and causes light to be transmitted therethrough.

14. An optical element array, comprising:
a plurality of first lenses regularly arranged in a two-dimensional array; and
a plurality of second lenses that includes a substrate, a plurality of stepped structures being formed on one surface of the substrate, each of the plurality of stepped structures having an annular stepped surface having a different height from the one surface, and a coating layer that continuously covers the stepped structure and the one surface on a periphery of the stepped structure and causes light to be transmitted therethrough, and corrects aberrations caused by the plurality of first lenses, light before or after being transmitted through the plurality of first lenses entering the plurality of second lenses.

15. The optical element array according to claim 14, wherein
each of the plurality of second lenses is a lens for correcting chromatic aberrations caused by the plurality of first lenses.

16. A lens group, comprising:
a first lens; and
a second lens that corrects an aberration caused by the first lens, light before or after being transmitted through the first lens entering the second lens, wherein
the second lens includes
a substrate, a stepped structure being formed on one surface of the substrate, the stepped structure having an annular stepped surface having a different height from the one surface, and
a coating layer that continuously covers the stepped structure and the one surface on a periphery of the stepped structure and causes light to be transmitted therethrough.

17. The lens group according to claim 16, wherein
the second lens is a lens for correcting a chromatic aberration caused by the first lens.

18. An electronic apparatus, comprising:
a solid-state imaging device that includes a microlens array including a substrate having a plurality of stepped structures of a plurality of stages regularly arranged in a two-dimensional array, and a coating layer that continuously covers the plurality of stepped structures of the plurality of stages and a surface of the substrate on a periphery of the plurality of stepped structures and causes light to be transmitted therethrough or reflects light, each of portions of the coating layer covering the plurality of stepped structures having a lens shape,
wherein each of the stepped structures includes a first stepped structure and a second stepped structure having an annular stepped surface surrounding a periphery of the first stepped structure, and
wherein the coating layer continuously covers the first stepped structure, the second stepped structure, and the one surface on a periphery of the first stepped structure and the second stepped structure and causes light to be transmitted therethrough;
an optical lens that forms an image of image light from a subject onto an imaging surface of the solid-state imaging device; and
a signal processing circuit that performs signal processing on a signal output from the solid-state imaging device.

19. A method of producing an optical element, comprising:
a step of forming a plurality of stepped structures regularly arranged in a two-dimensional array on a substrate;
a step of applying a coating liquid to the substrate on which the plurality of stepped structures has been formed; and
a step of drying the coating liquid so that a coating layer that continuously covers the plurality of stepped structures and a surface of the substrate on a periphery of the plurality of stepped structures and causes light to be transmitted therethrough is formed,
wherein each of the plurality of stepped structures includes an annular recessed portion for forming a lens, light before or after being transmitted through a color filter entering the lens, and
in the step of forming the plurality of stepped structures on the substrate, a width and a diameter of each of the plurality of annular recessed portions are adjusted in accordance with a wavelength range of light transmitted through the color filter corresponding to the annular recessed portion.

* * * * *